United States Patent
Shih

(10) Patent No.: US 8,304,846 B2
(45) Date of Patent: Nov. 6, 2012

(54) SILICON MICROPHONE WITH INTEGRATED BACK SIDE CAVITY

(75) Inventor: Wei-Yan Shih, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 131 days.

(21) Appl. No.: 12/969,859

(22) Filed: Dec. 16, 2010

(65) Prior Publication Data
US 2011/0156179 A1  Jun. 30, 2011

Related U.S. Application Data

(60) Provisional application No. 61/291,763, filed on Dec. 31, 2009.

(51) Int. Cl.
*H01L 29/84* (2006.01)
(52) U.S. Cl. .......................... 257/416; 257/415
(58) Field of Classification Search ............. 257/415, 257/416
See application file for complete search history.

(56) References Cited

U.S. PATENT DOCUMENTS

| | | | |
|---|---|---|---|
| 5,452,268 | A | 9/1995 | Bernstein |
| 5,677,965 | A | 10/1997 | Moret et al. |
| 2002/0067663 | A1 | 6/2002 | Loeppert et al. |
| 2007/0065968 | A1* | 3/2007 | Kok et al. ........... 438/53 |
| 2009/0169035 | A1 | 7/2009 | Rombach et al. |

FOREIGN PATENT DOCUMENTS

JP  2001-145196  5/2001

OTHER PUBLICATIONS

U.S. Appl. No. 12/969,784, filed Dec. 16, 2010 and correspondence.

* cited by examiner

*Primary Examiner* — Bradley K Smith
(74) *Attorney, Agent, or Firm* — Warren L. Franz; Wade J. Brady, III; Frederick J. Telecky, Jr.

(57) ABSTRACT

An integrated circuit containing a capacitive microphone with a back side cavity located within the substrate of the integrated circuit. Access holes may be formed through a dielectric support layer at the surface of the substrate to provide access for etchants to the substrate to form the back side cavity. The back side cavity may be etched after a fixed plate and permeable membrane of the capacitive microphone are formed by providing etchants through the permeable membrane and through the access holes to the substrate.

16 Claims, 33 Drawing Sheets

US 8,304,846 B2

SILICON MICROPHONE WITH INTEGRATED BACK SIDE CAVITY

CROSS-REFERENCE TO RELATED APPLICATIONS

The following co-pending patent application deals with related subject matter and is hereby incorporated by reference: U.S. patent application Ser. No. 12/969,784, filed Dec. 16, 2010. With its mention in this section, this patent application is not admitted to be prior art with respect to the present invention.

FIELD OF THE INVENTION

This invention relates to the field of integrated circuits. More particularly, this invention relates to microphones in integrated circuits.

BACKGROUND OF THE INVENTION

Integration of a microphone in an integrated circuit may require formation of a back cavity to attain desired levels of microphone sensitivity. Formation of a back cavity with a sufficient volume may increase fabrication cost and complexity of the integrated circuit.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit containing a capacitive microphone with a back side cavity may be formed so that the back side cavity is located within the substrate of the integrated circuit. Access holes may be formed through a dielectric support layer on the surface of the substrate to provide access for etchants to the substrate to form the back side cavity. The back side cavity may be etched after a fixed plate and permeable membrane of the capacitive microphone are formed by providing etchants through the permeable membrane and through the access holes to the substrate.

DETAILED DESCRIPTION

Figure 1A:
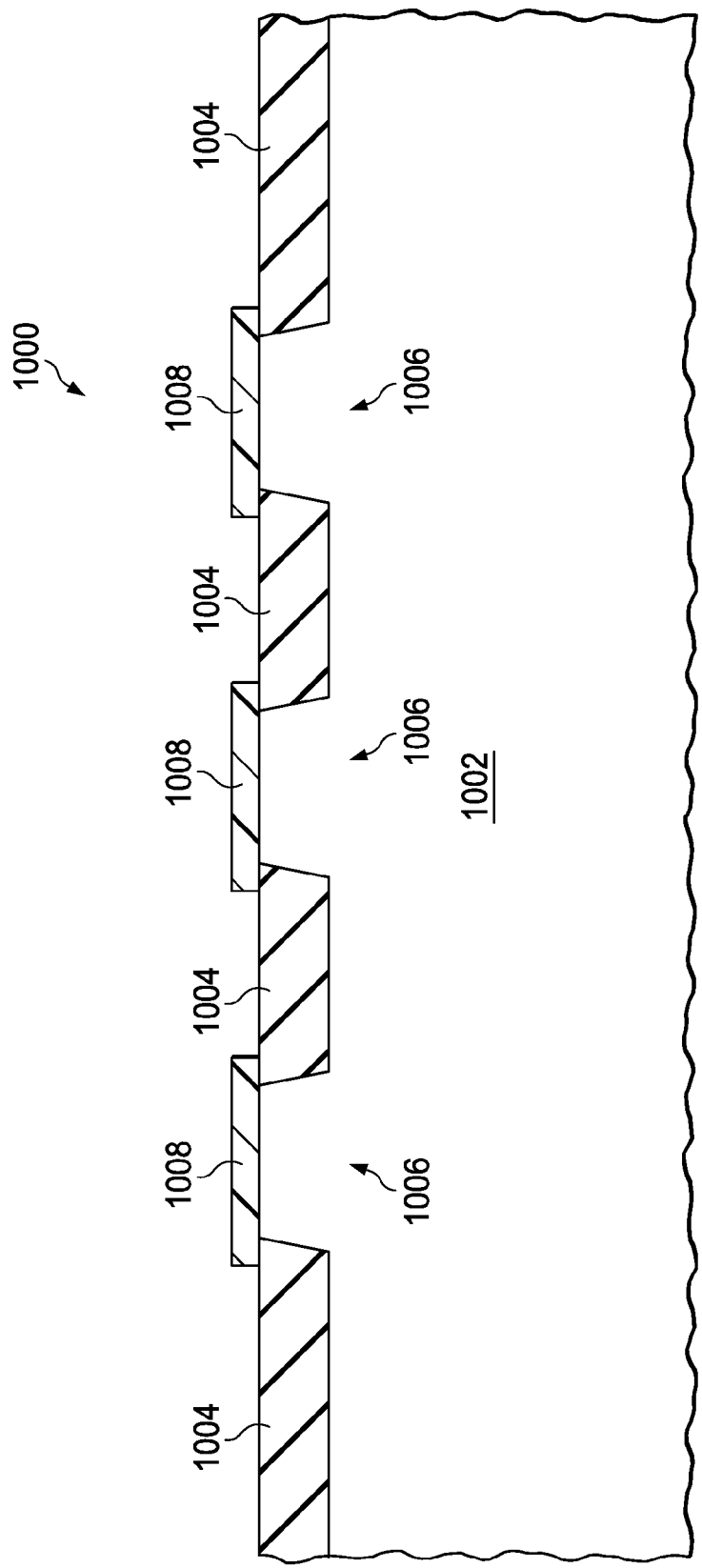
FIG. 1A through FIG. 1I are cross-sections of an integrated circuit containing a capacitive microphone formed according to a first embodiment, depicted in successive stages of fabrication.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

A capacitive microphone may be formed in an integrated circuit by etching a back cavity in a substrate of the integrated circuit such that the cavity does not extend to a bottom surface of the substrate. Etching of the cavity may further be performed at a top surface of the integrated circuit. A dielectric support layer may be formed on a top surface of the substrate, and access holes may be formed in the dielectric support layer to provide access to the substrate for cavity etchants from the top surface of the integrated circuit.

FIG. 1A through FIG. 1I are cross-sections of an integrated circuit containing a capacitive microphone formed according to a first embodiment, depicted in successive stages of fabrication. Referring to FIG. 1A, the integrated circuit (1000) is formed in and on a substrate (1002) which is commonly a single crystal silicon wafer, but may be a silicon-on-insulator (SOI) wafer, a hybrid orientation technology (HOT) wafer with regions of different crystal orientations, or other structure with a semiconductor region at a top surface of the substrate (1002) appropriate for fabrication of the IC (1000). A dielectric support layer (1004) is formed at the top surface of the substrate (1002). In the instant embodiment, the dielectric support layer (1004) is substantially formed of field oxide (1004) using shallow trench isolation (STI) processes in which trenches, commonly 200 to 500 nanometers deep, are etched into the integrated circuit (1000), electrically passivated, commonly by growing a thermal oxide layer on sidewalls of the trenches, and filled with insulating material, typically silicon dioxide, commonly by a high density plasma (HDP) process or an ozone based thermal chemical vapor deposition (CVD) process, also known as the high aspect ratio process (HARP). It is within the scope of alternate embodiments to form dielectric support layers of field oxide using local oxidation of silicon (LOCOS) processes. Access holes (1006) are formed in the field oxide (1004) to provide access to the substrate (1002) in a subsequent cavity etching step. The field oxide (1004) is contiguous in a region defined for the capacitive microphone. One or more optional silicide block layers (1008) may be formed on a top surface of the substrate (1002) over the access holes (1006) to prevent formation of metal silicide on the substrate (1002) during subsequent fabrication steps. The silicide block layers (1008) may be silicon nitride between 10 and 100 nanometers thick in one example, or silicon dioxide between 250 and 200 nanometers thick in another example. The silicide block layers (1008), if formed, may be removed during subsequent fabrication steps.

Figure 1B:
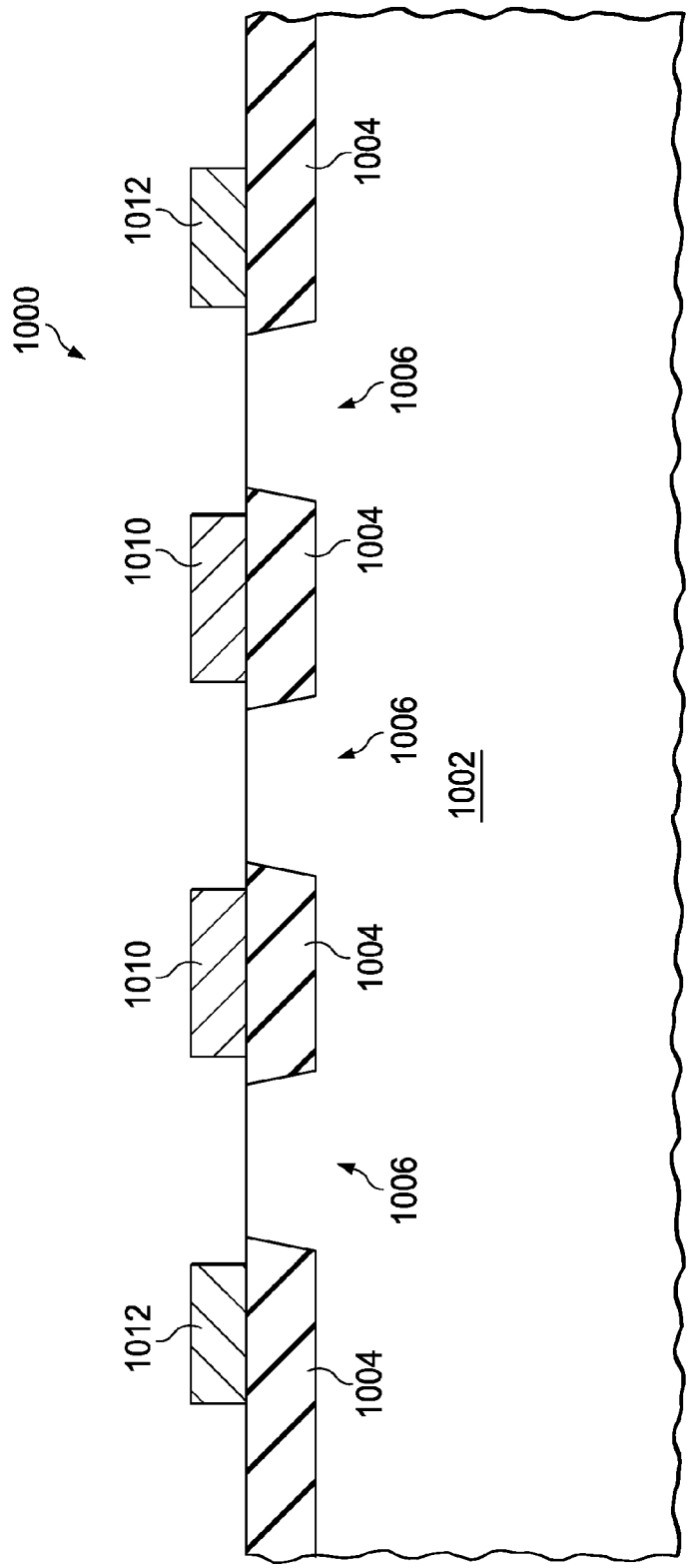

Referring to FIG. 1B, a fixed plate (1010) is formed above the field oxide (1004) adjacent to the access holes (1006). The fixed plate (1010) provides one capacitor plate of the capacitive microphone. Optional membrane terminals (1012) may be formed concurrently with the fixed plate (1010), as depicted in FIG. 1B, or may be formed in other fabrication steps. In one realization of the instant embodiment, the fixed plate (1010) and optional membrane terminals (1012), if formed, may be fully silicided polycrystalline silicon. In other realizations of the instant embodiment, the fixed plate (1010) and optional membrane terminals (1012), if formed, may be a metal such as tungsten or aluminum. In one realization, the fixed plate (1010) may be less than 100 microns wide. A protective layer (not shown), possibly an electrically insulating layer, may optionally be formed over the fixed plate (1010) to isolate the fixed plate (1010) during an operational lifetime of the capacitive microphone.

Figure 1C:
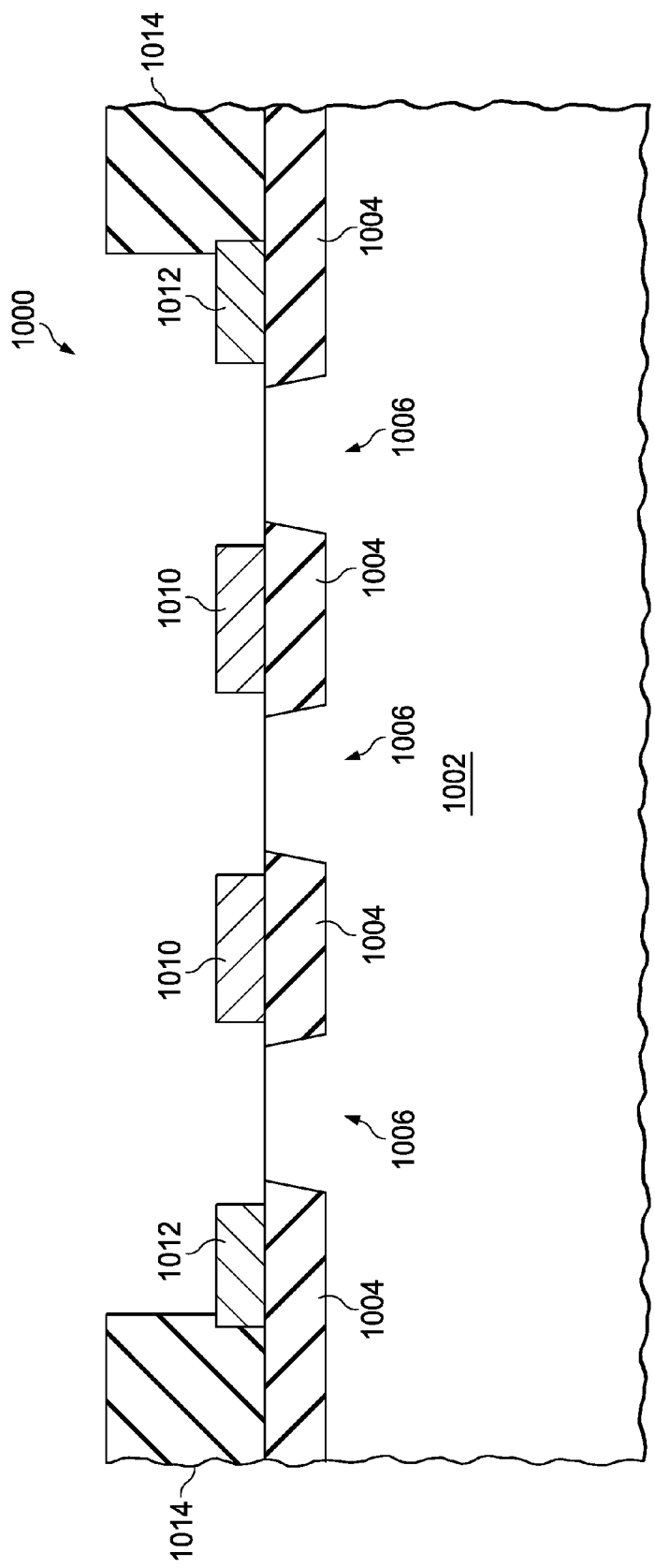

Referring to FIG. 1C, optional interconnect and dielectric levels (1014) may be formed above the substrate (1002). The dielectric levels may be silicon dioxide or a low-k dielectric material, such as organo-silicate glass (OSG), carbon-doped silicon oxides (SiCO or CDO) or methylsilsesquioxane (MSQ). The interconnect levels may include aluminum or copper.

Figure 1D:
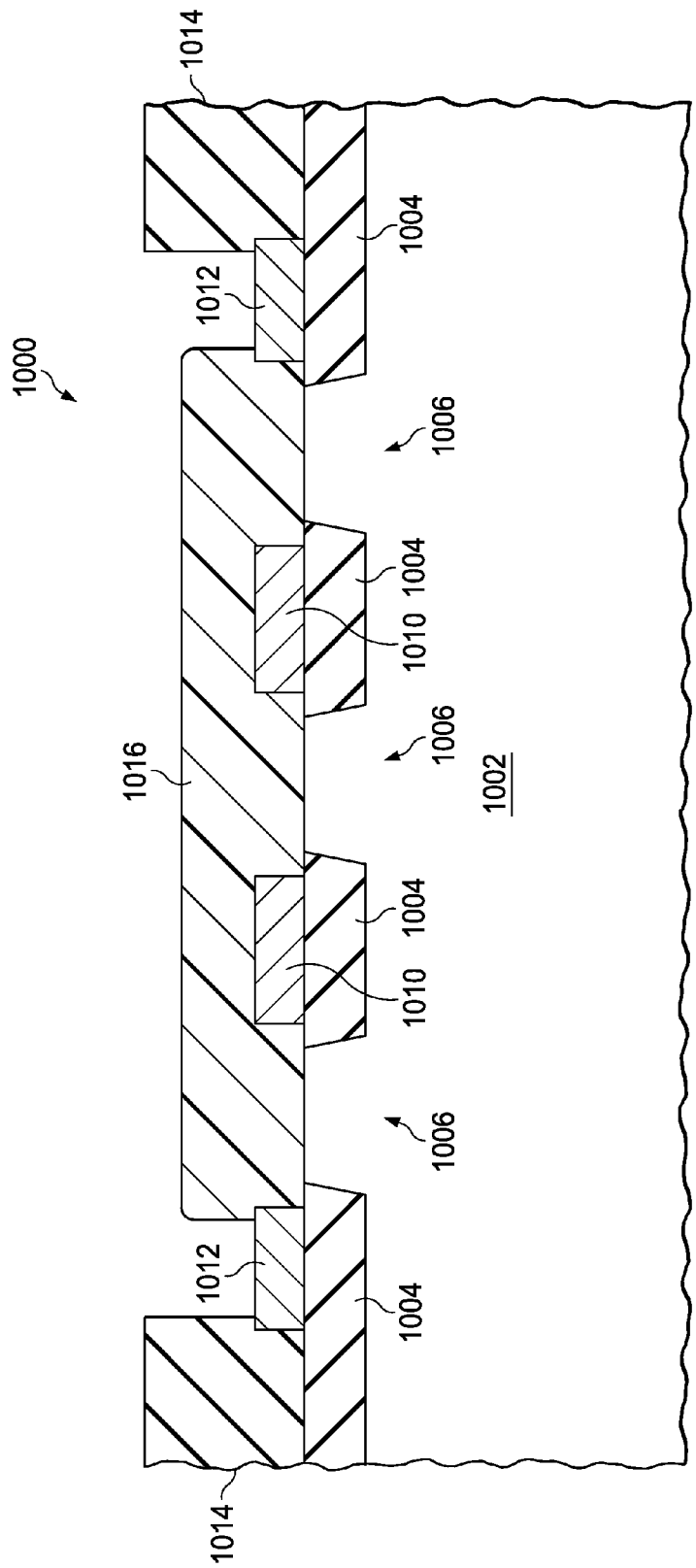

Referring to FIG. 1D, a capacitor cavity sacrificial layer (1016) is formed above the fixed plate (1010). The capacitor cavity sacrificial layer (1016) includes sacrificial material such as photoresist or polyimide. In one realization of the instant embodiment, the capacitor cavity sacrificial layer (1016) may be formed by photolithographic processes, for example by forming a layer of photo-sensitive sacrificial material on an existing top surface of the integrated circuit (1000), exposing a pattern of the photo-sensitive sacrificial material using photolithographic equipment, for example a wafer stepper or a wafer scanner, and developing the photo-sensitive sacrificial material to leave the capacitor cavity sacrificial layer (1016). In another realization, a layer of sacrificial material may be formed on the existing top surface of the integrated circuit (1000), a photoresist pattern may be formed above the layer of sacrificial material to define an area for the capacitor cavity sacrificial layer (1016), and unwanted sacrificial material removed, to leave the capacitor cavity sacrificial layer (1016). Other processes to form the capacitor cavity sacrificial layer (1016) are within the scope of the instant embodiment.

Figure 1E:
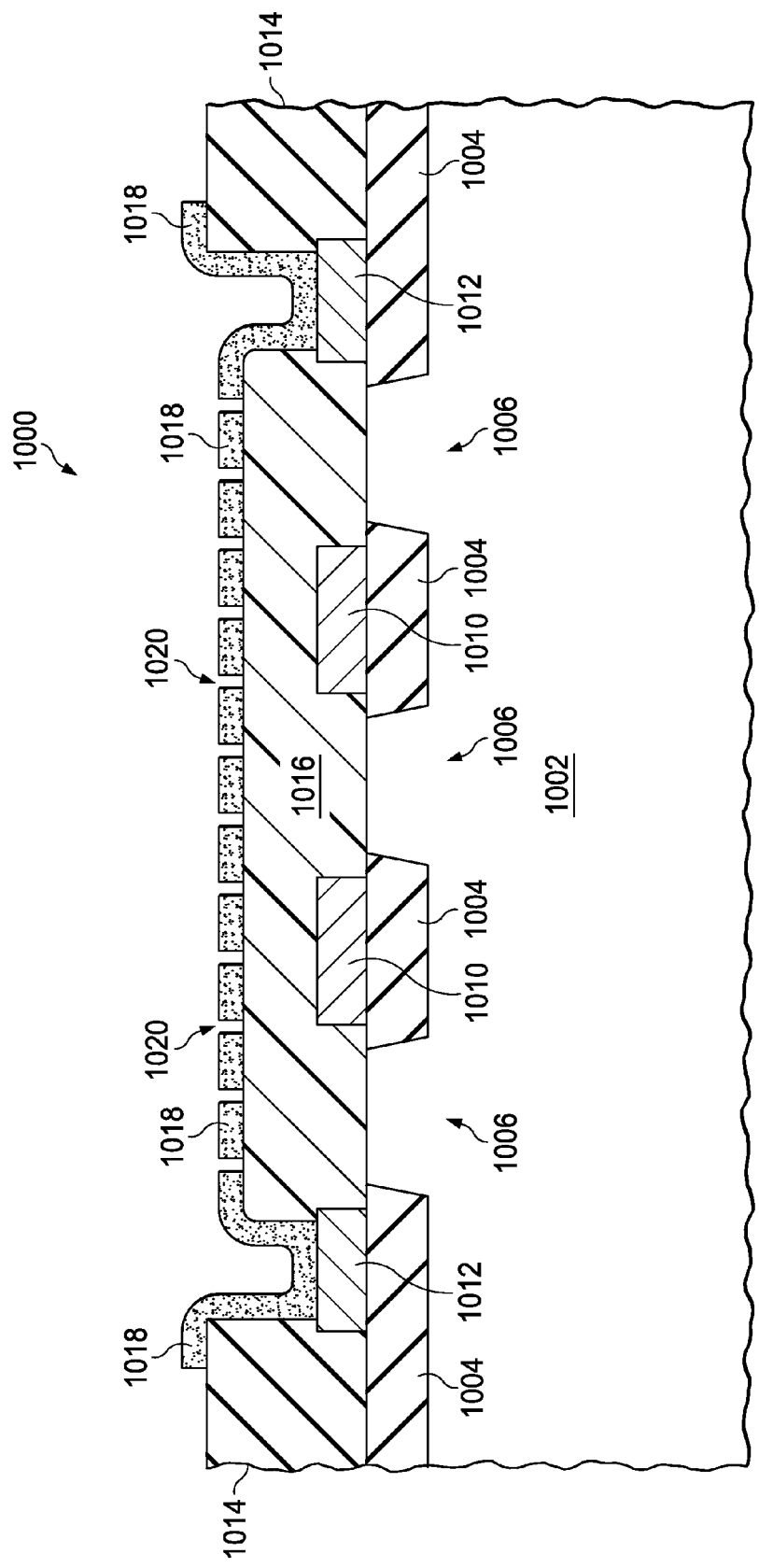

Referring to FIG. 1E, a contiguous permeable membrane (1018) is formed on the capacitor cavity sacrificial layer (1016). The permeable membrane (1018) provides a second capacitor plate of the capacitive microphone. In one realization of the instant embodiment, the permeable membrane (1018) may be formed of a metal used in interconnect levels in the integrated circuit (1000). Membrane holes (1020) are formed in the permeable membrane (1018). In one realization of the instant embodiment, a vertical separation between a bottom surface of the permeable membrane (1018) and a top surface of the fixed plate (1010) is less than 200 nanometers. In an alternate realization of the instant embodiment, vertical separation between the bottom surface of the permeable membrane (1018) and the top surface of the fixed plate (1010) is less than 100 nanometers.

Figure 1F:
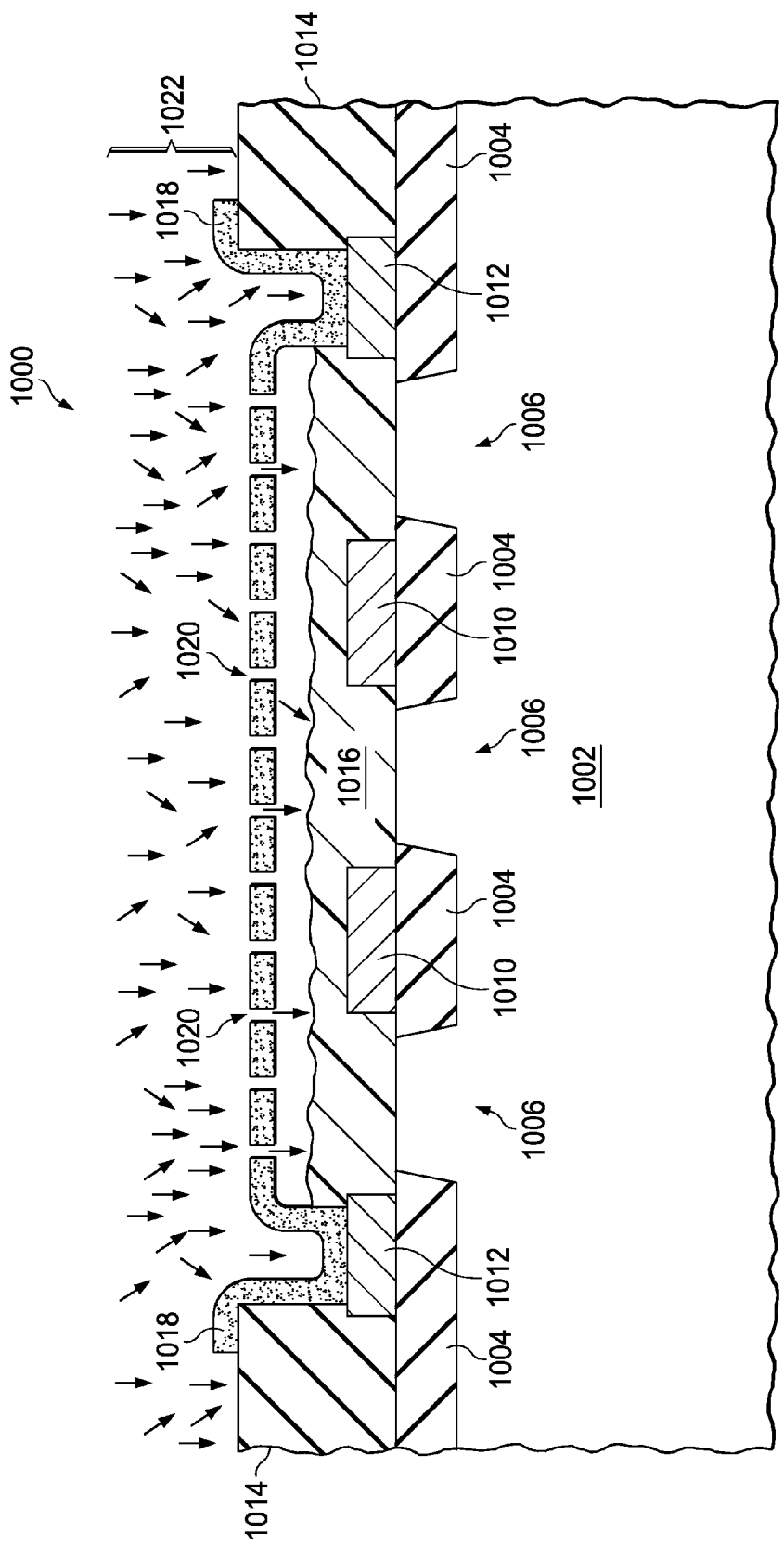

Referring to FIG. 1F, a sacrificial layer removal process (1022) is performed to remove sacrificial material from the capacitor cavity sacrificial layer (1016). In one realization of the instant embodiment, the sacrificial layer removal process (1022) provides reactive molecules, atoms or radicals which diffuse through the membrane holes (1020) and remove sacrificial material from the capacitor cavity sacrificial layer (1016), as depicted in FIG. 1F. In a realization of the instant embodiment, the sacrificial layer removal process (1022) generates reactive oxygen species and possibly reactive fluorine species in a remote plasma and provides a means for the reactive oxygen species to diffuse to the integrated circuit (1000) in an electric field-free region. In another realization of the instant embodiment, the sacrificial layer removal process (1022) provides ozone to the integrated circuit (1000). In an alternate realization of the instant embodiment, the sacrificial layer removal process (1022) provides an increased temperature to the integrated circuit, for example between 300 C and 500 C, and possibly a reactive ambient, for example oxygen, causing decomposition of the sacrificial material in the capacitor cavity sacrificial layer (1016).

Figure 1G:
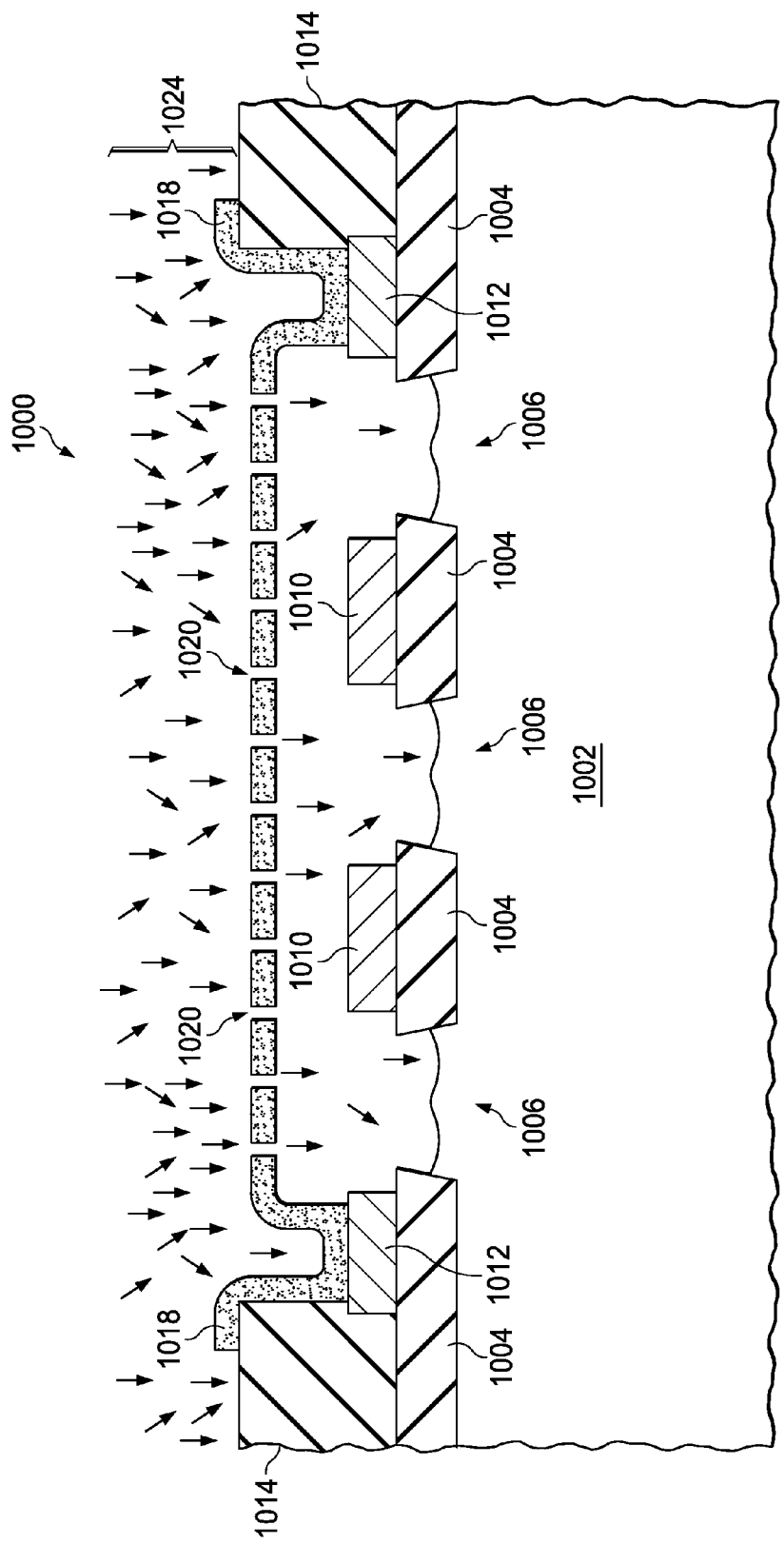

Referring to FIG. 1G, a cavity formation process (1024) is performed to provide reactive species through the membrane holes (1020) to the substrate (1002) in the access holes (1006). In one realization of the instant embodiment, the cavity formation process (1024) uses $SF_6$ gas in a plasma to provide fluorine containing reactive species to the substrate (1002). Semiconductor material is removed from exposed surfaces of the substrate (1002) by the reactive species provided by the cavity formation process (1024). An etch rate of the field oxide (1004) is much less than an etch rate of the substrate (1002) by the cavity formation process (1024), for example less than 5 percent.

Figure 1H:
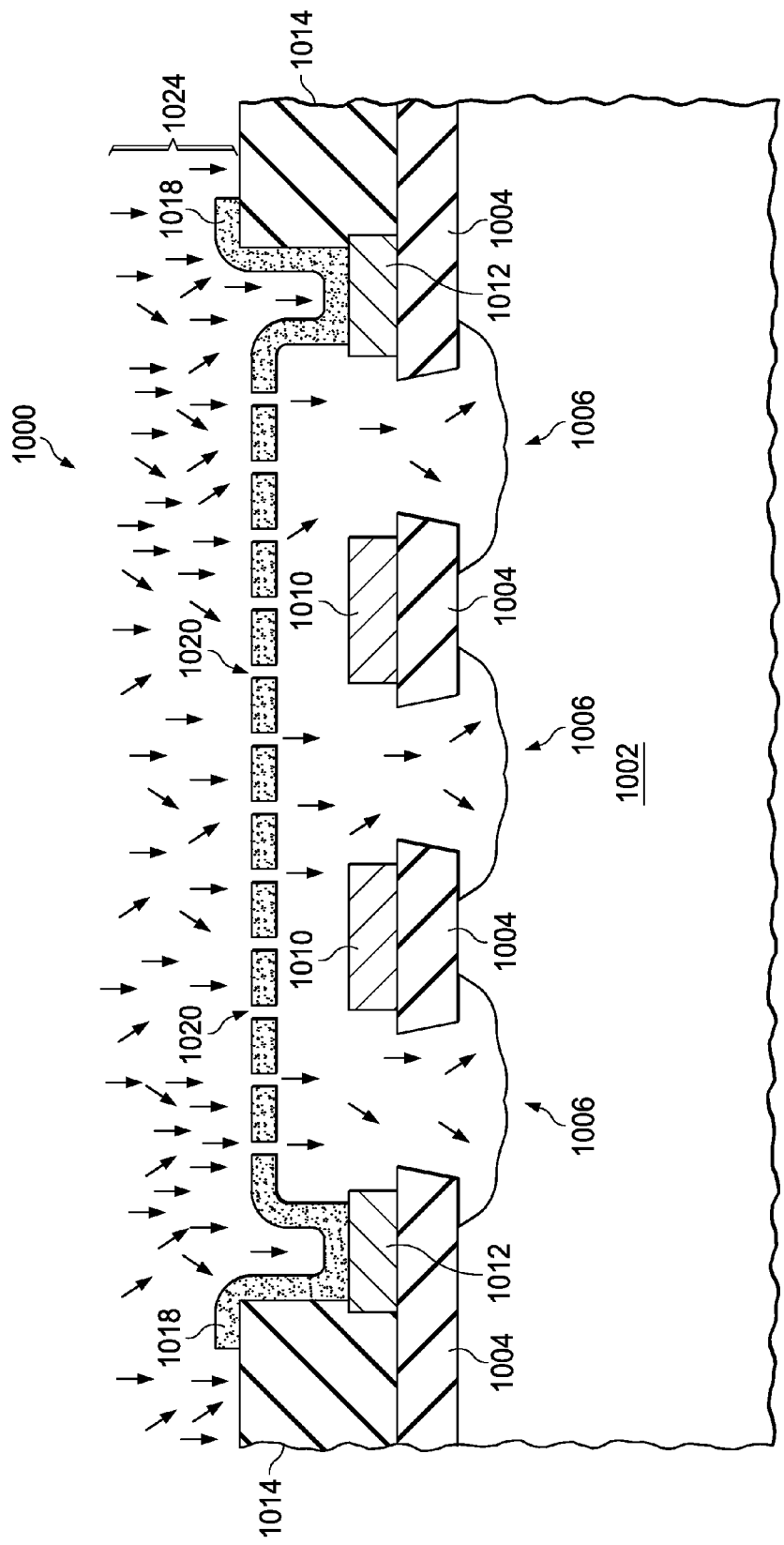

FIG. 1H depicts the integrated circuit (1000) during a later stage of the cavity formation process (1024). Reactive species from the cavity formation process (1024) diffuse through the access holes (1006) and remove semiconductor material from the substrate (1002) under the field oxide (1004) adjacent to the access holes (1006).

Figure 1I:
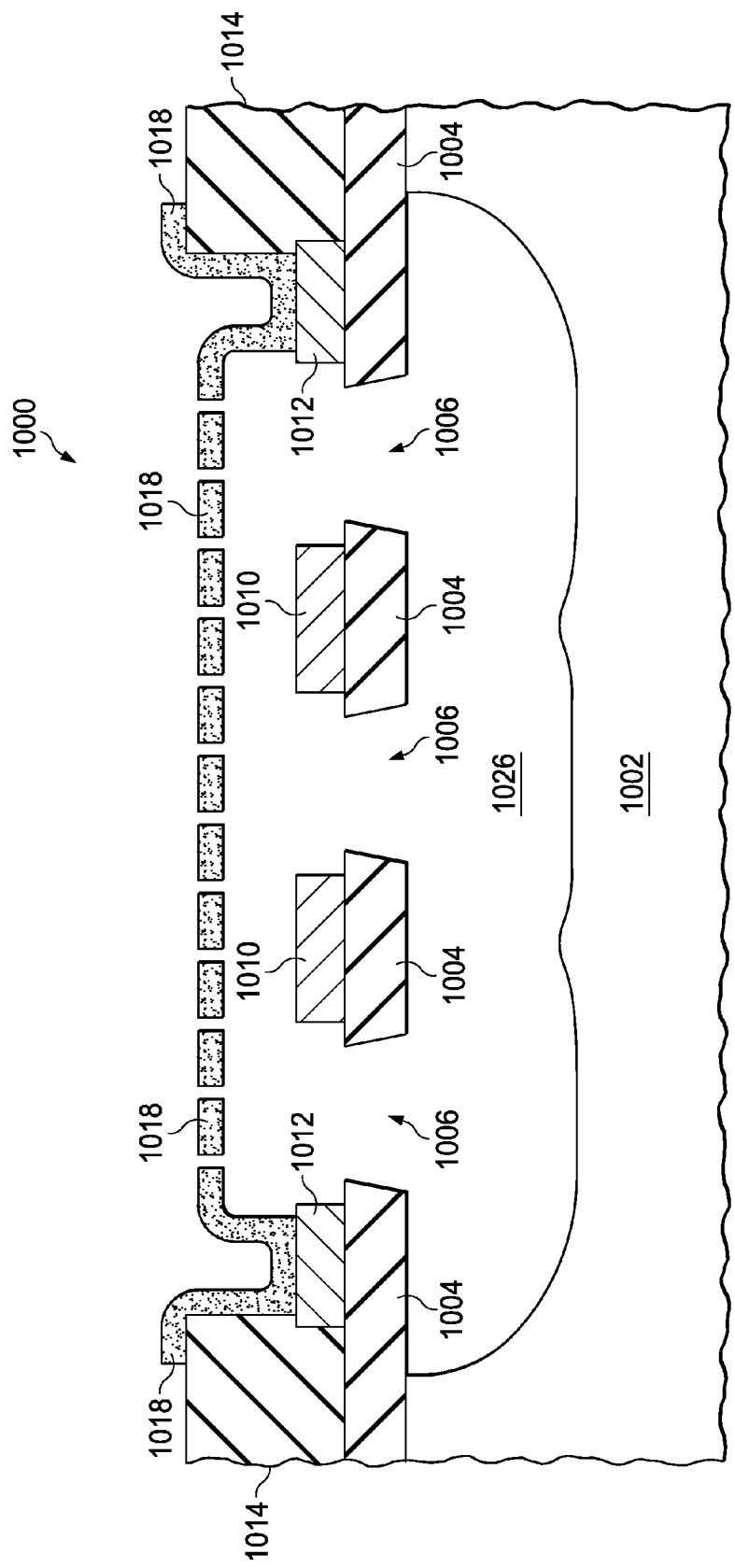

FIG. 1I depicts the integrated circuit (1000) after formation of the capacitive microphone is substantially complete. A back side cavity (1026) has been formed in the substrate (1002) under the fixed plate (1010) of the capacitive microphone, such that a bottom of the back side cavity (1026) is within the substrate (1002). A protective coating (not shown) may optionally be formed on exposed surfaces of the membrane (1018) and the back side cavity (1026) for protection during an operational lifetime of the capacitive microphone. The back-side cavity connects to a space between the fixed plate (1010) and the membrane (1018) through the access holes (1006). In one realization of the instant embodiment, the back side cavity (1026) may extend laterally beyond the membrane (1018). In one realization of the instant embodiment, a volume of the back side cavity (1026) is more than 100 times as large as a volume of the space between the fixed plate (1010) and the membrane (1018). In a further embodiment, the volume of the back side cavity (1026) is more than 1000 times as large as the volume of the space between the fixed plate (1010) and the membrane (1018).

Figure 2A:
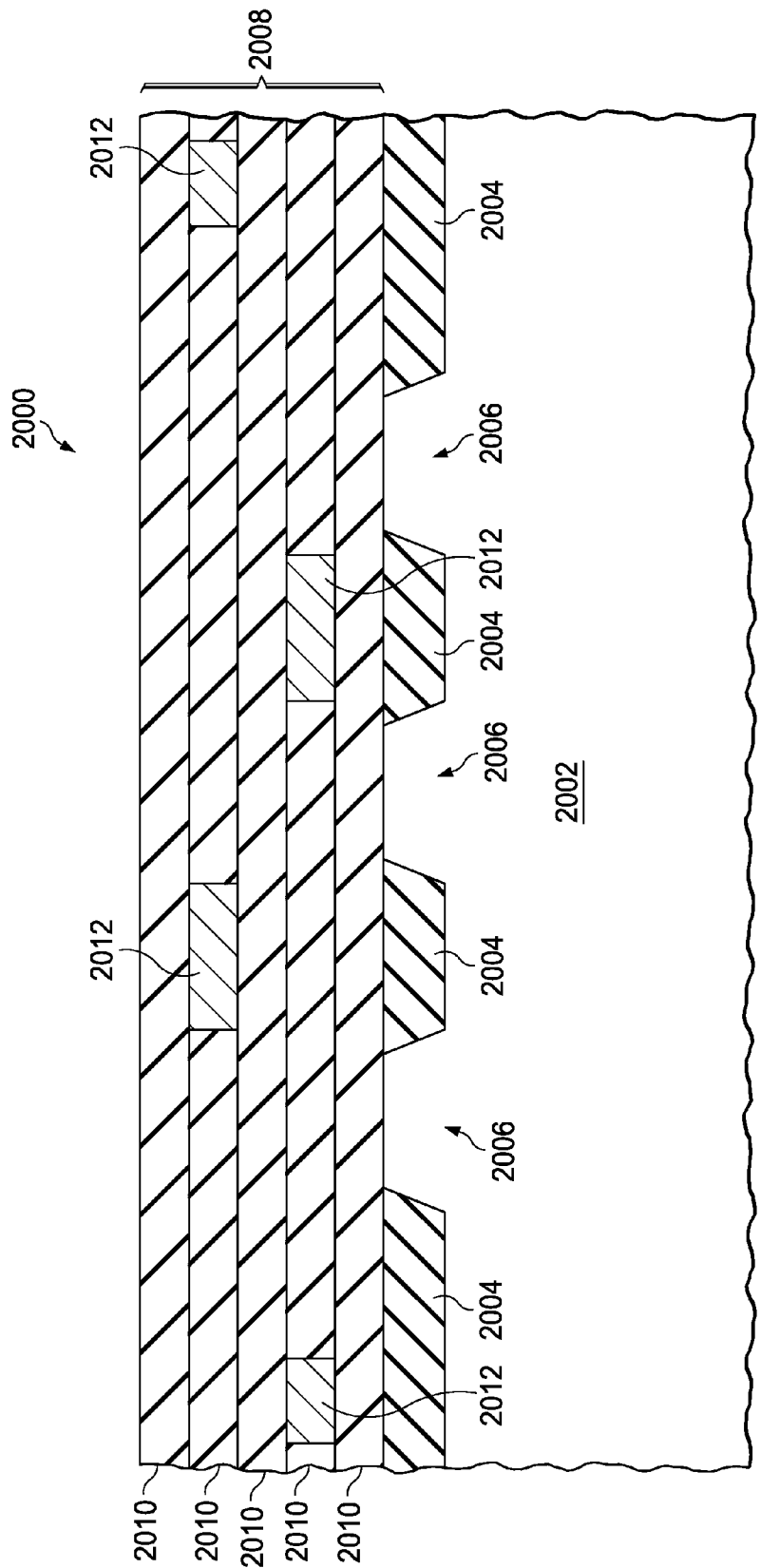
FIG. 2A through FIG. 2H are cross-sections of an integrated circuit containing a capacitive microphone formed according to a second embodiment, depicted in successive stages of fabrication.

FIG. 2A through FIG. 2H are cross-sections of an integrated circuit containing a capacitive microphone formed according to a second embodiment, depicted in successive stages of fabrication. Referring to FIG. 2A, the integrated circuit (2000) is formed in and on a substrate (2002) as described in reference to FIG. 1A. In the instant embodiment, a contiguous dielectric support layer of STI field oxide (2004) is formed at a top surface of the substrate (2002) with access holes (2006) in the field oxide (2004) as described in reference to FIG. 1A. In one realization of the instant embodiment, metal silicide is prevented from forming on a top surface of the substrate (2002) in the access holes (2006), as described in reference to FIG. 1A. An interconnect region (2008) is formed above the substrate (2002) and field oxide (2004), which includes dielectric layers (2010) and metal interconnect components (2012). In some realizations of the instant embodiment, no metal interconnect components (2012) are located in an area defined for the capacitive microphone. In the instant embodiment, no metal interconnect components (2012) are located directly above the access holes (2006).

Figure 2B:
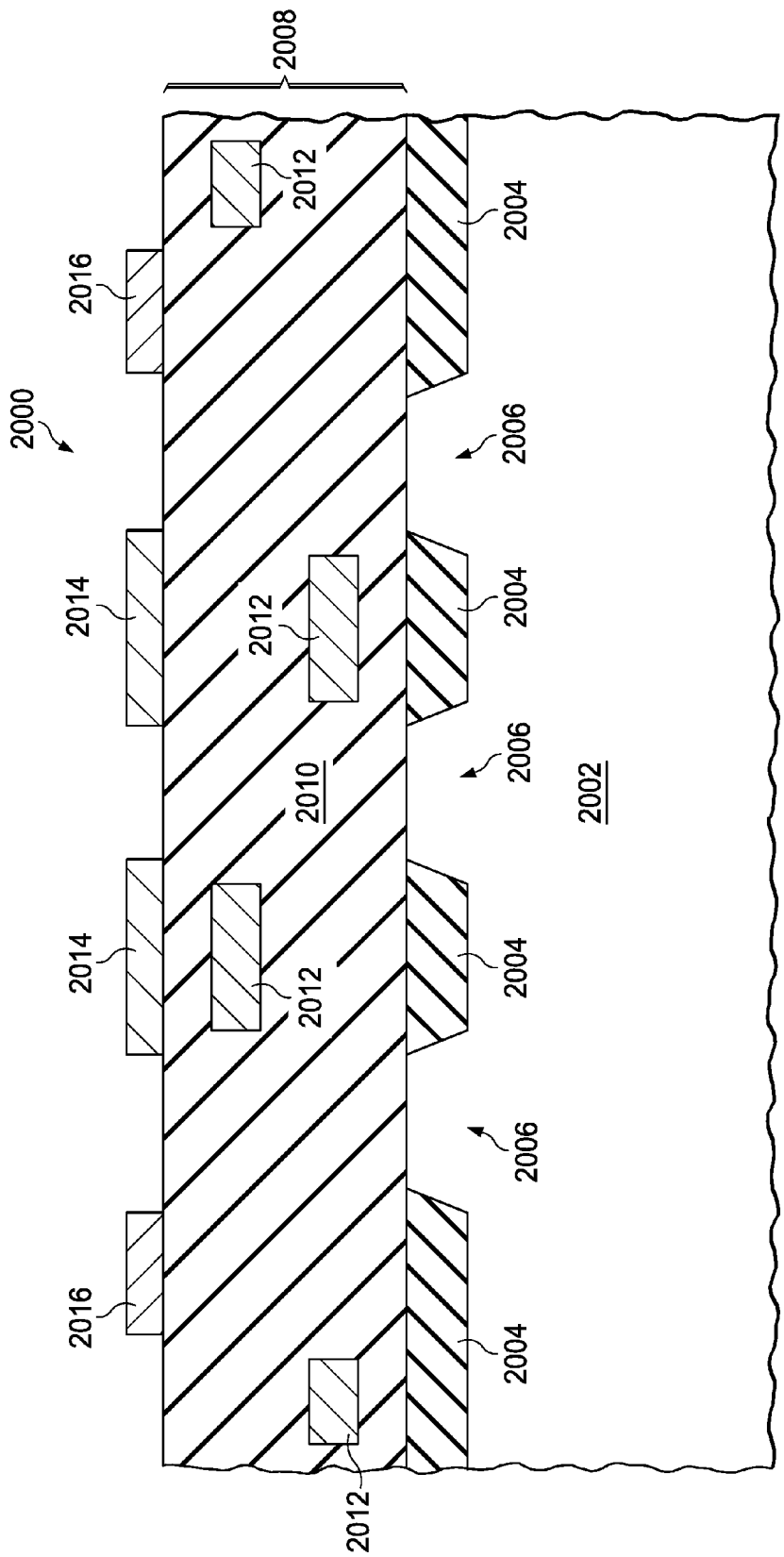

Referring to FIG. 2B, a fixed plate (2014) is formed above the interconnect region (2008). In one realization of the instant embodiment, the fixed plate (2014) is formed of similar materials as the metal interconnect components (2012) in the interconnect region (2008). In the instant embodiment, no portions of the fixed plate (2014) are located directly above the access holes (2006). Optional membrane terminals (2016) may be formed concurrently with the fixed plate (2014), as depicted in FIG. 2B, or may be formed in other fabrication steps. In one realization of the instant embodiment, the fixed plate (2014) and optional membrane terminals (2016), if present, include aluminum. In an alternate realization of the instant embodiment, the fixed plate (2014) and optional membrane terminals (2016), if present, include copper. A protective layer (not shown), possibly an electrically insulating layer, may optionally be formed over the fixed plate (2014) to isolate the fixed plate (2014) during an operational lifetime of the capacitive microphone. In FIG. 2B and following figures of the instant embodiment, boundary lines between the dielectric layers in the interconnect region (2008) are not shown for clarity.

Figure 2C:
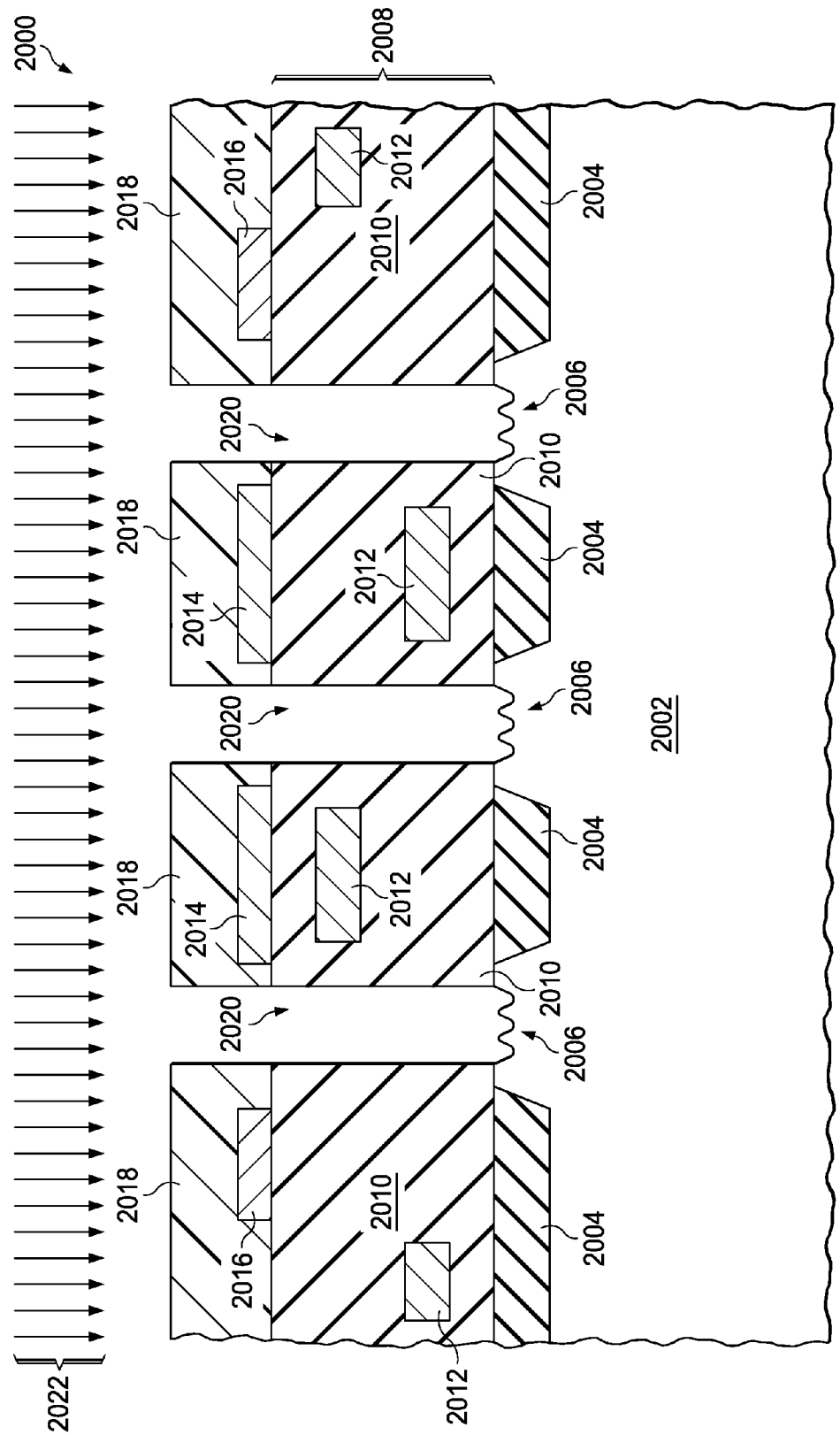

Referring to FIG. 2C, an access via photoresist pattern (2018) is formed on an existing top surface of the integrated circuit (2000) to define areas for access vias (2020) in the interconnect region (2008). An access via etch process (2022) removes dielectric material from the interconnect region (2008) to form the access vias (2020). In one realization of the instant embodiment, the access via etch process (2022) may be performed using a reactive ion etch (RIE) process, which directs reactive ions toward the top surface of the integrated circuit (2000). In one instance, the RIE process may include a fluorine containing plasma. The access vias (2020) extend to the semiconductor material in the substrate (2002) in the access holes (2006) through the field oxide (2004). The access via photoresist pattern (2018) is removed after formation of the access vias (2020) is complete, for example by exposing the integrated circuit (2000) to an oxygen containing plasma, followed by a wet cleanup to remove any organic residue from the top surface of the integrated circuit (2000).

Figure 2D:
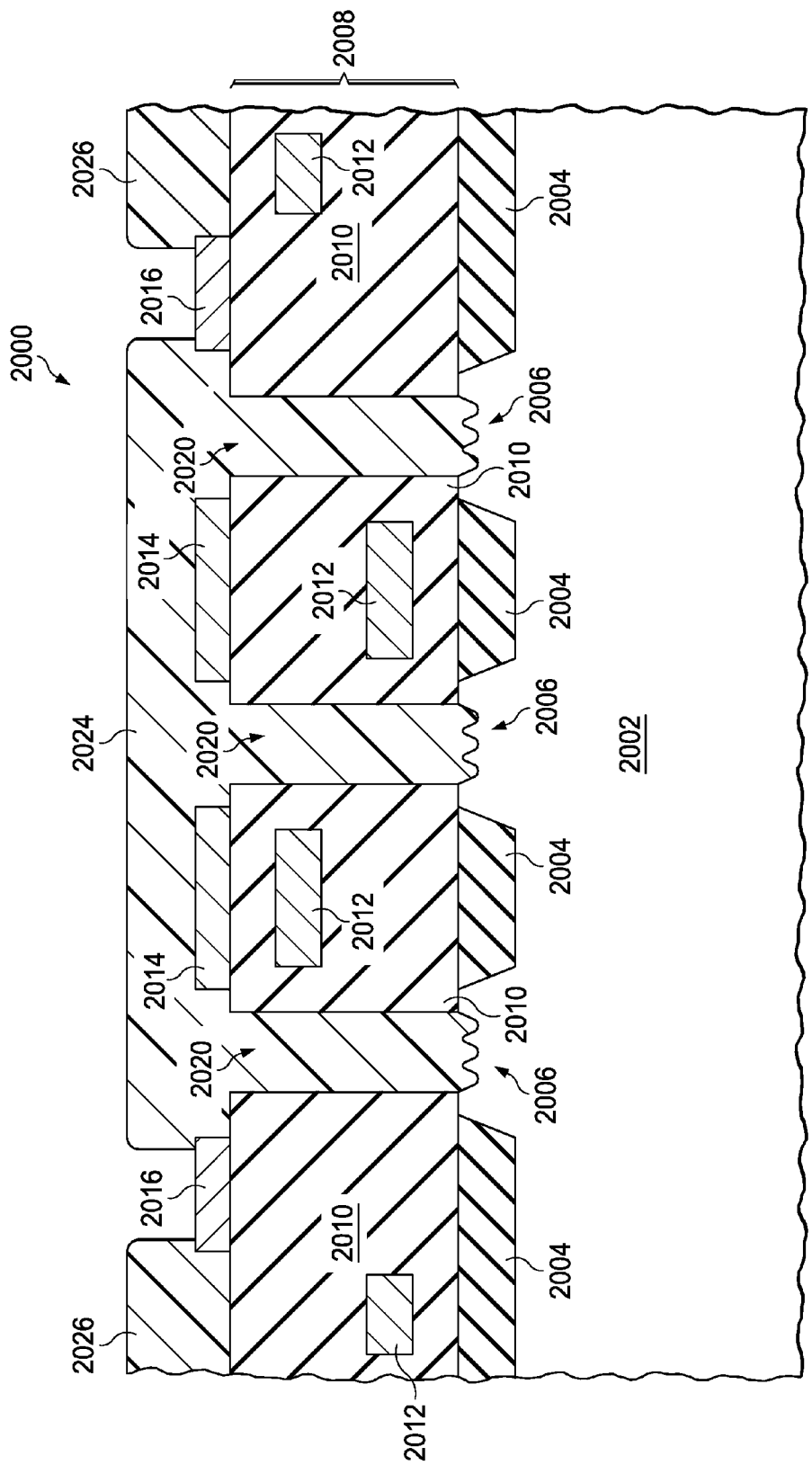

Referring to FIG. 2D, a capacitor cavity sacrificial layer (2024) is formed above the fixed plate (2014), as described in reference to FIG. 1D. Other processes to form the capacitor cavity sacrificial layer (2024) are within the scope of the instant embodiment. The capacitor cavity sacrificial layer (2024) includes sacrificial material such as photoresist or polyimide. In one realization of the instant embodiment, additional sacrificial material (2026) may be formed outside an area defined for the capacitive microphone. The sacrificial material of the capacitor cavity sacrificial layer (2024) extends into the access vias (2020), and may fill the access vias (2020) as depicted in FIG. 2D.

Figure 2E:
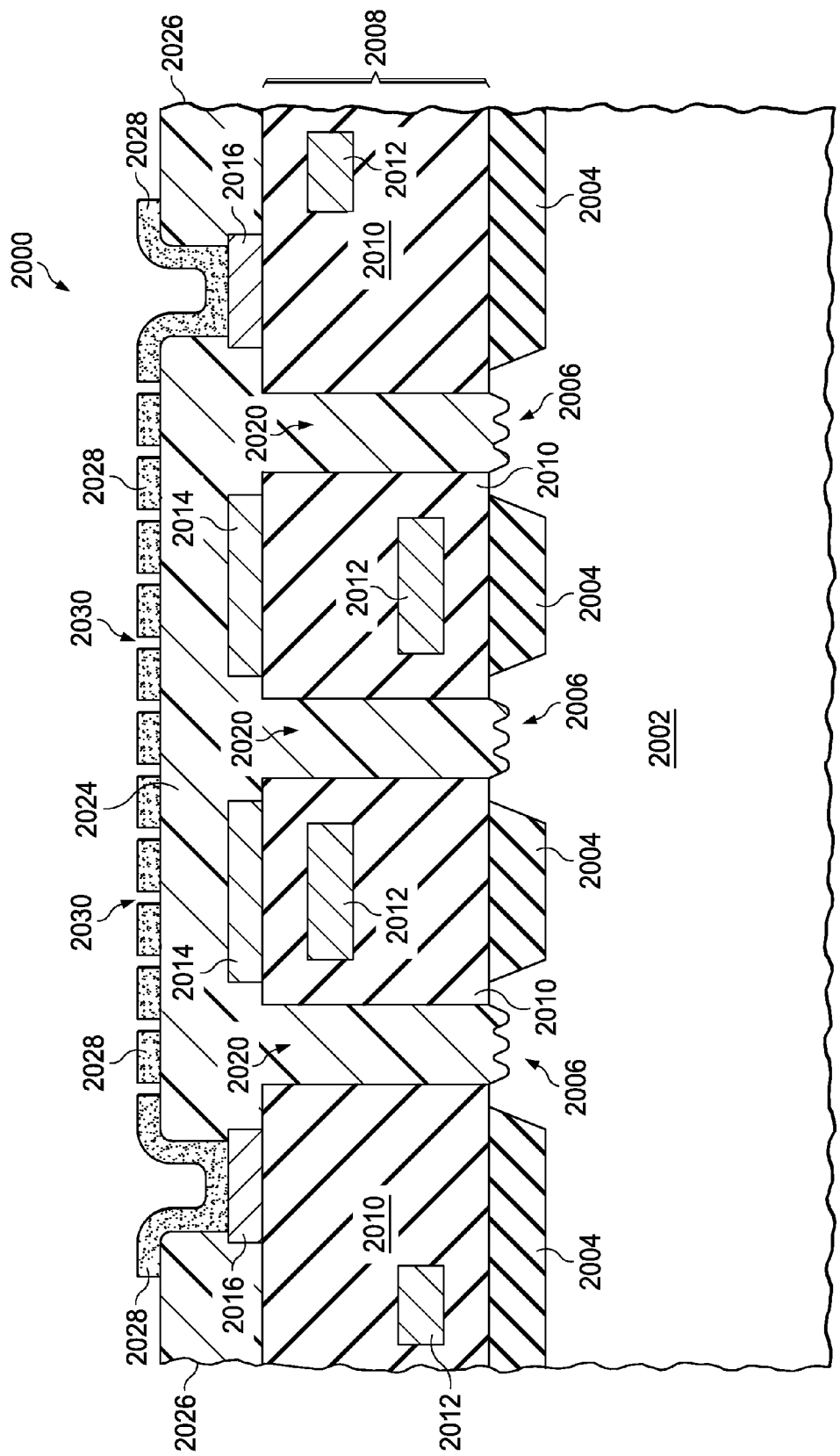

Referring to FIG. 2E, a contiguous permeable membrane (2028) is formed on the capacitor cavity sacrificial layer (2024), as described in reference to FIG. 1E. Membrane holes (2030) are formed in the permeable membrane (2028) as described in reference to FIG. 1E. In one realization of the instant embodiment, a vertical separation between a bottom surface of the permeable membrane (2028) and a top surface of the fixed plate (2014) is less than 200 nanometers. In an alternate realization of the instant embodiment, vertical separation between the bottom surface of the permeable membrane (2028) and the top surface of the fixed plate (2014) is less than 100 nanometers.

Figure 2F:
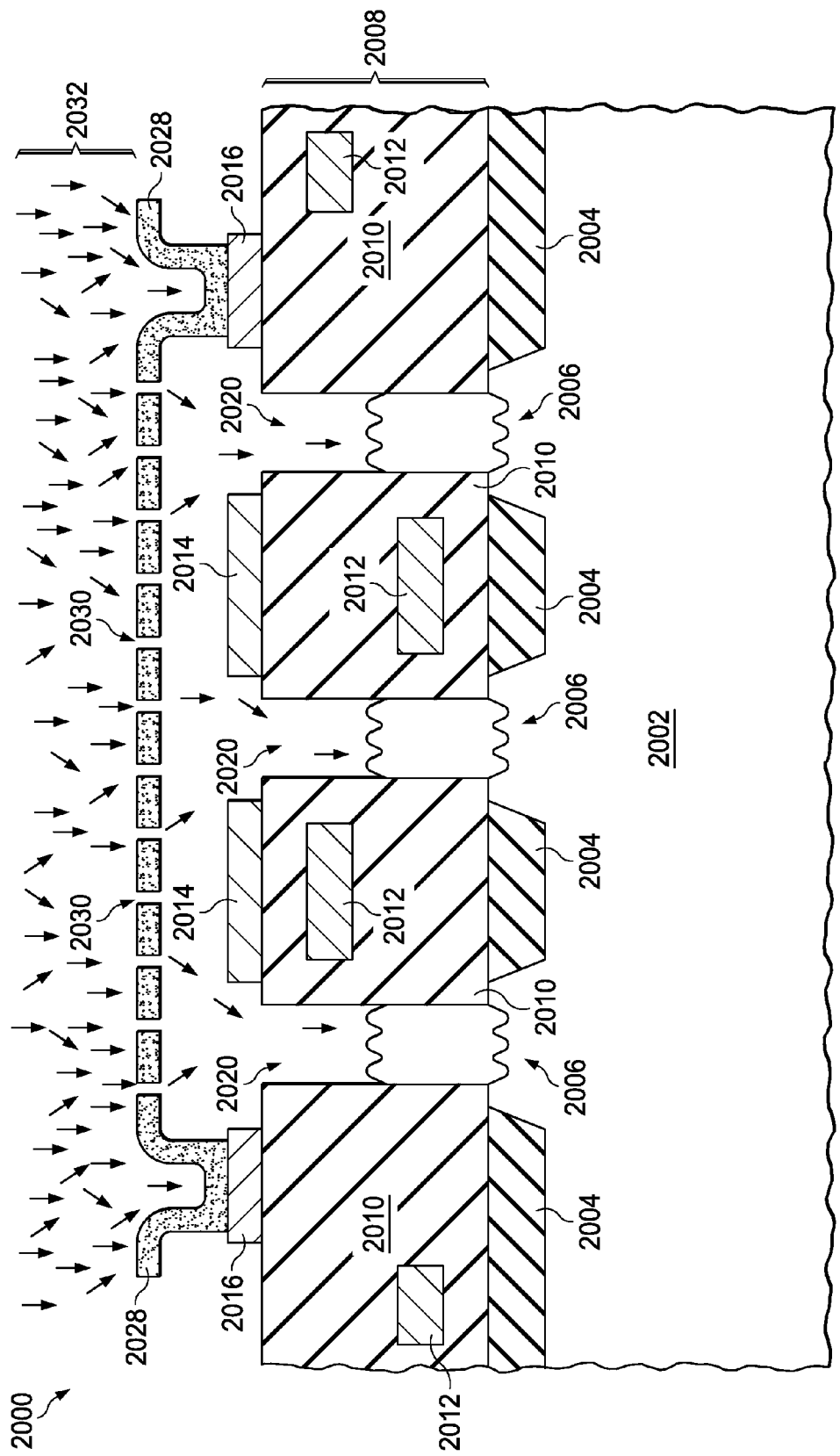

Referring to FIG. 2F, a sacrificial layer removal process (2032) is performed to remove sacrificial material from the capacitor cavity sacrificial layer (2024), as described in reference to FIG. 1F. In the instant embodiment, sacrificial material is removed from the access vias (2020).

Figure 2G:
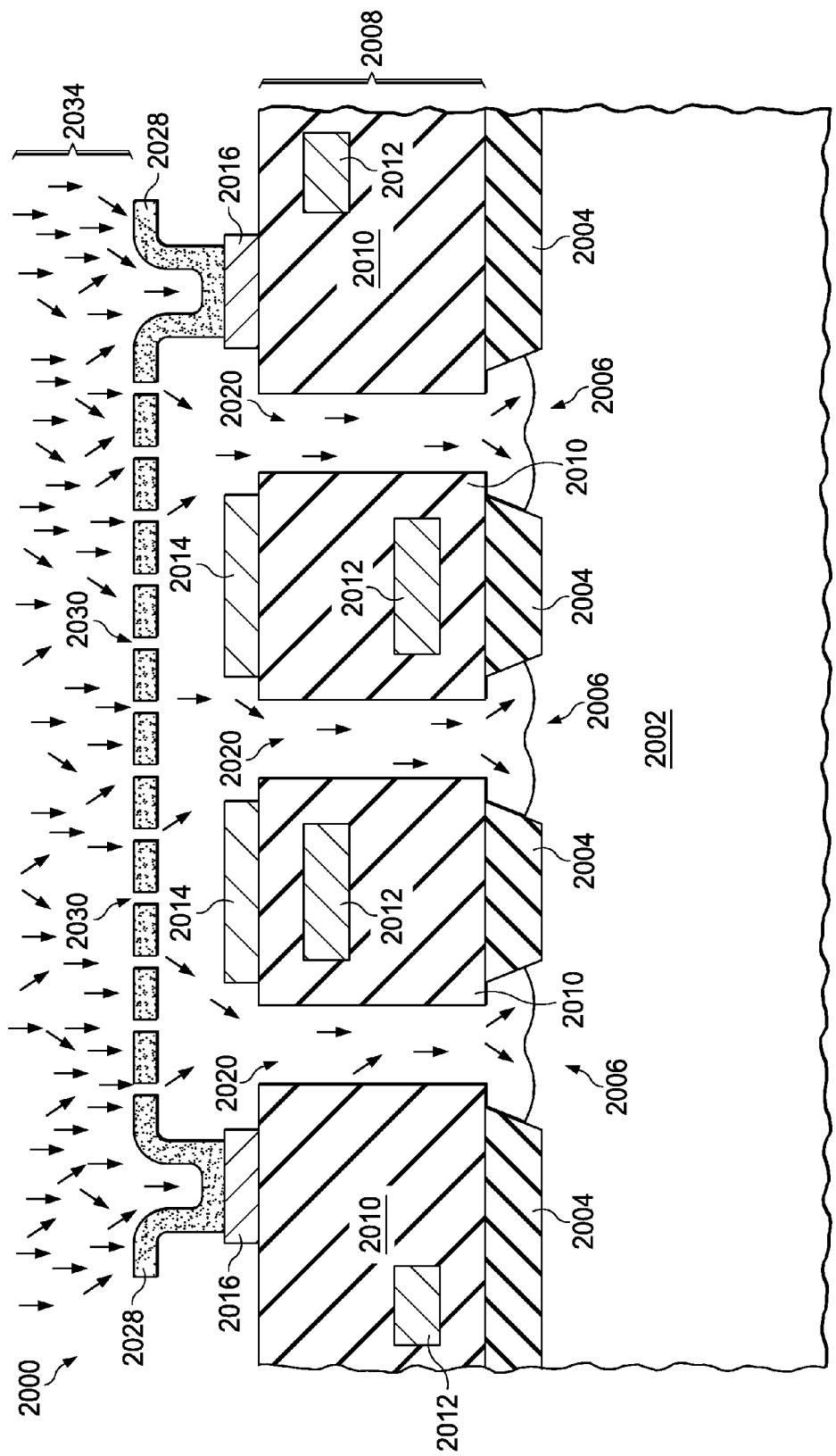

Referring to FIG. 2G, a cavity formation process (2034) is performed to provide reactive species through the membrane holes (2030) to the substrate (2002), as described in reference to FIG. 1G. Reactive species from the cavity formation process (2034) diffuse through the access vias (2020) and remove semiconductor material from the substrate (2002) as described in reference to FIG. 1G and FIG. 1H.

Figure 2H:
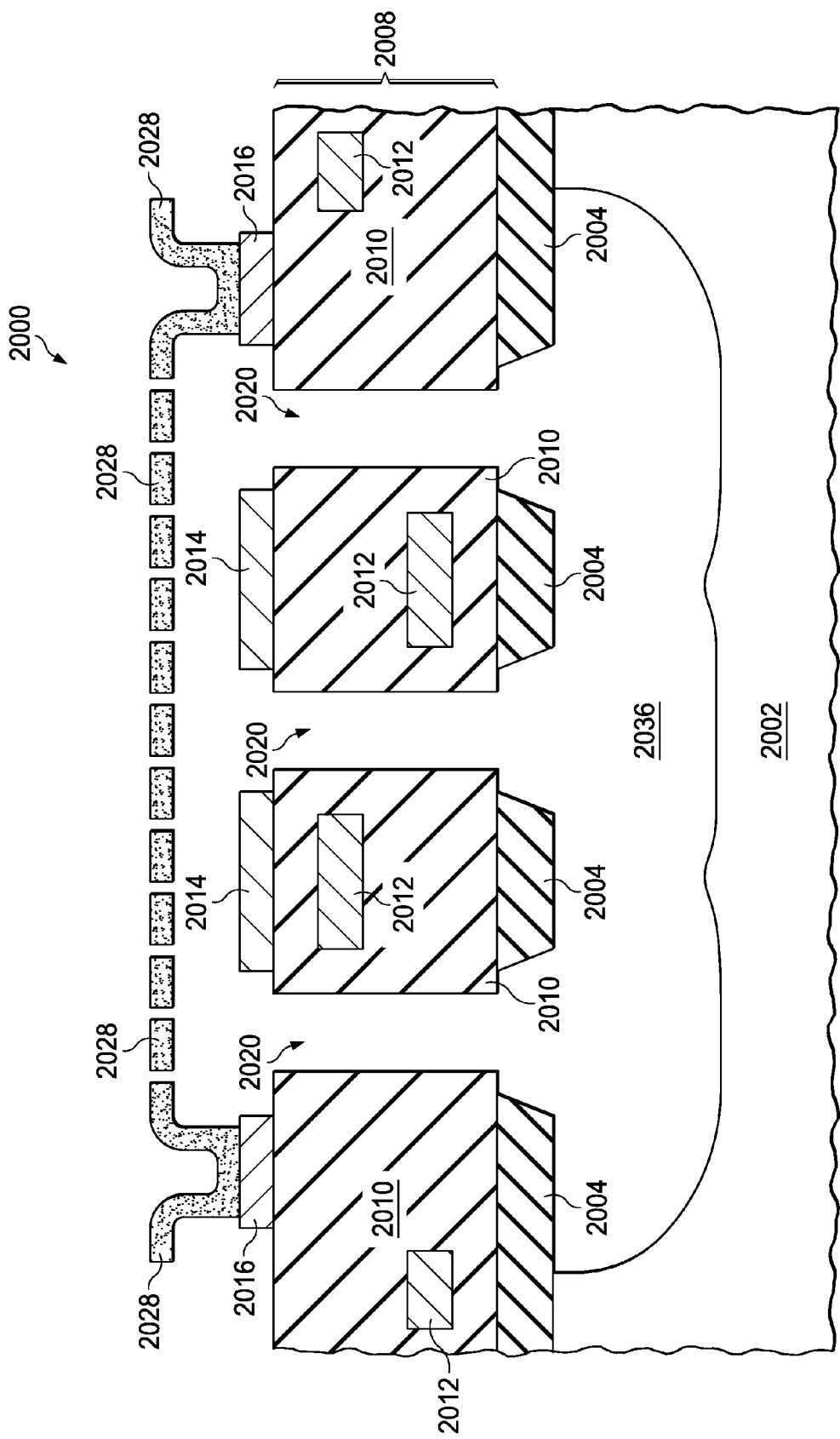

FIG. 2H depicts the integrated circuit (2000) after formation of the capacitive microphone is substantially complete. A back side cavity (2036) has been formed in the substrate (2002) under the field oxide (2004) of the integrated circuit (2000), such that a bottom of the back side cavity (2036) is within the substrate (2002). A protective coating (not shown) may optionally be formed on exposed surfaces of the membrane (2028) and the back side cavity (2036) for protection during an operational lifetime of the capacitive microphone. The back-side cavity connects to a space between the fixed plate (2014) and the membrane (2028) through the access holes (2006) and the access vias (2020). In one realization of the instant embodiment, the back side cavity (2036) may extend laterally beyond the membrane (2028). In one realization of the instant embodiment, a sum of a volume of the back side cavity (2036) and a volume of the access vias (2020) is more than 100 times as large as a volume of the space between the fixed plate (2014) and the membrane (2028). In a further embodiment, the sum of the volume of the back side cavity (2036) and the volume of the access vias (2020) is more than 1000 times as large as the volume of the space between the fixed plate (2014) and the membrane (2028).

Figure 3A:
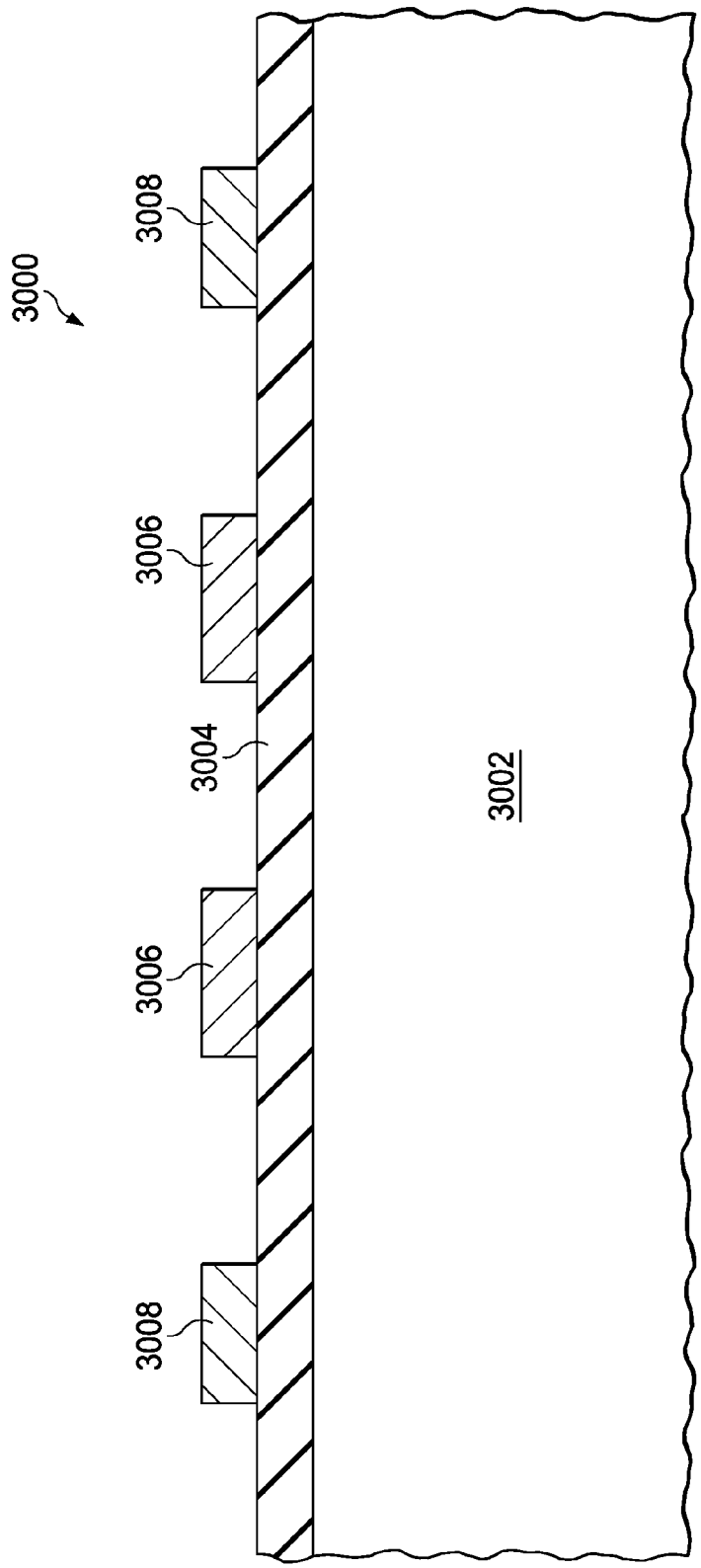
FIG. 3A through FIG. 3H are cross-sections of an integrated circuit containing a capacitive microphone formed according to a third embodiment, depicted in successive stages of fabrication.

FIG. 3A through FIG. 3H are cross-sections of an integrated circuit containing a capacitive microphone formed according to a third embodiment, depicted in successive stages of fabrication. Referring to FIG. 3A, the integrated circuit (3000) is formed in and on a substrate (3002) as described in reference to FIG. 1A. In the instant embodiment, a dielectric support layer (3004) is formed on a top surface of the substrate (3002) in an area defined for the capacitive microphone. In one realization of the instant embodiment, the dielectric support layer (3004) may extend across the entire top surface of the integrated circuit (3000). A fixed plate (3006) is formed above the dielectric support layer (3004). The fixed plate (3006) provides one capacitor plate of the capacitive microphone. Optional membrane terminals (3008) may be formed concurrently with the fixed plate (3006), as depicted in FIG. 3A, or may be formed in other fabrication steps. In one realization of the instant embodiment, the fixed plate (3006) and optional membrane terminals (3008), if formed, may be fully silicided polycrystalline silicon. In other realizations of the instant embodiment, the fixed plate (3006) and optional membrane terminals (3008), if formed, may be a metal such as tungsten or aluminum. In one realization, the fixed plate (3006) may be less than 100 microns wide. A protective layer (not shown), possibly an electrically insulating layer, may optionally be formed over the fixed plate (3006) to isolate the fixed plate (3006) during an operational lifetime of the capacitive microphone.

Figure 3B:
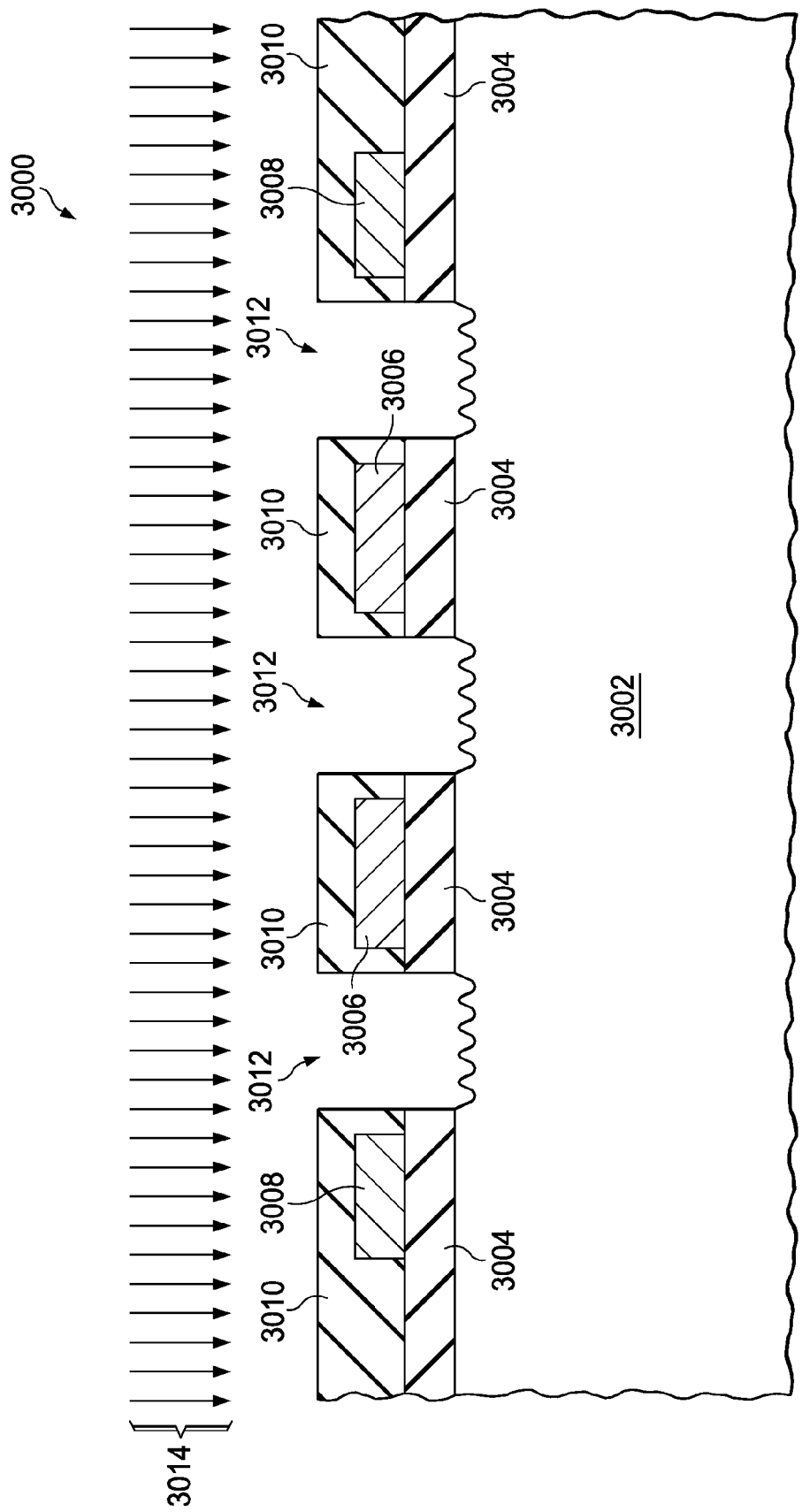

Referring to FIG. 3B, an access hole photoresist pattern (3010) is formed on an existing top surface of the integrated circuit (3000) to define areas for access holes (3012) adjacent to the fixed plate (3006) through the dielectric support layer (3004). An access hole etch process (3014) removes dielectric material from the dielectric support layer (3004) to expose the substrate (3002) in the access holes (3012). In one realization of the instant embodiment, the access hole etch process (3014) may include an RIE process with a fluorine containing plasma. In another realization, the access hole etch process (3014) may be performed using a wet etch, for example a dilute, possibly buffered, solution of hydrofluoric acid. After the access holes (3012) are formed, the access hole photoresist pattern (3010) is removed, for example by exposing the integrated circuit (3000) to an oxygen containing plasma, followed by a wet cleanup to remove any organic residue from the top surface of the integrated circuit (3000).

Figure 3C:
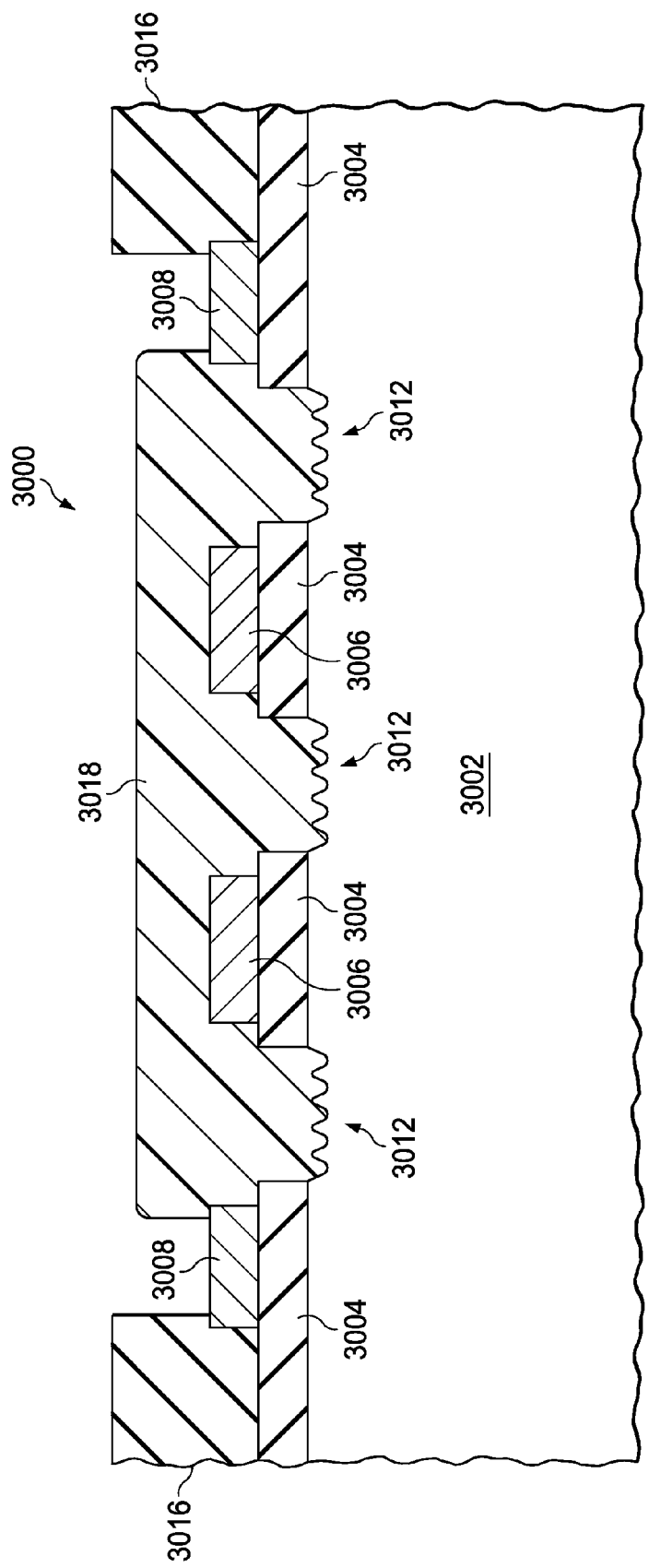

Referring to FIG. 3C, optional interconnect and dielectric levels (3016) may be formed above the substrate (2002), as described in reference to FIG. 1C. A capacitor cavity sacrificial layer (3018) is formed above the fixed plate (3006) as described in reference to FIG. 1D. Other processes to form the capacitor cavity sacrificial layer (3018) are within the scope of the instant embodiment. The capacitor cavity sacrificial layer (3018) includes sacrificial material such as photoresist or polyimide. The sacrificial material extends into the access holes (3012).

Figure 3D:
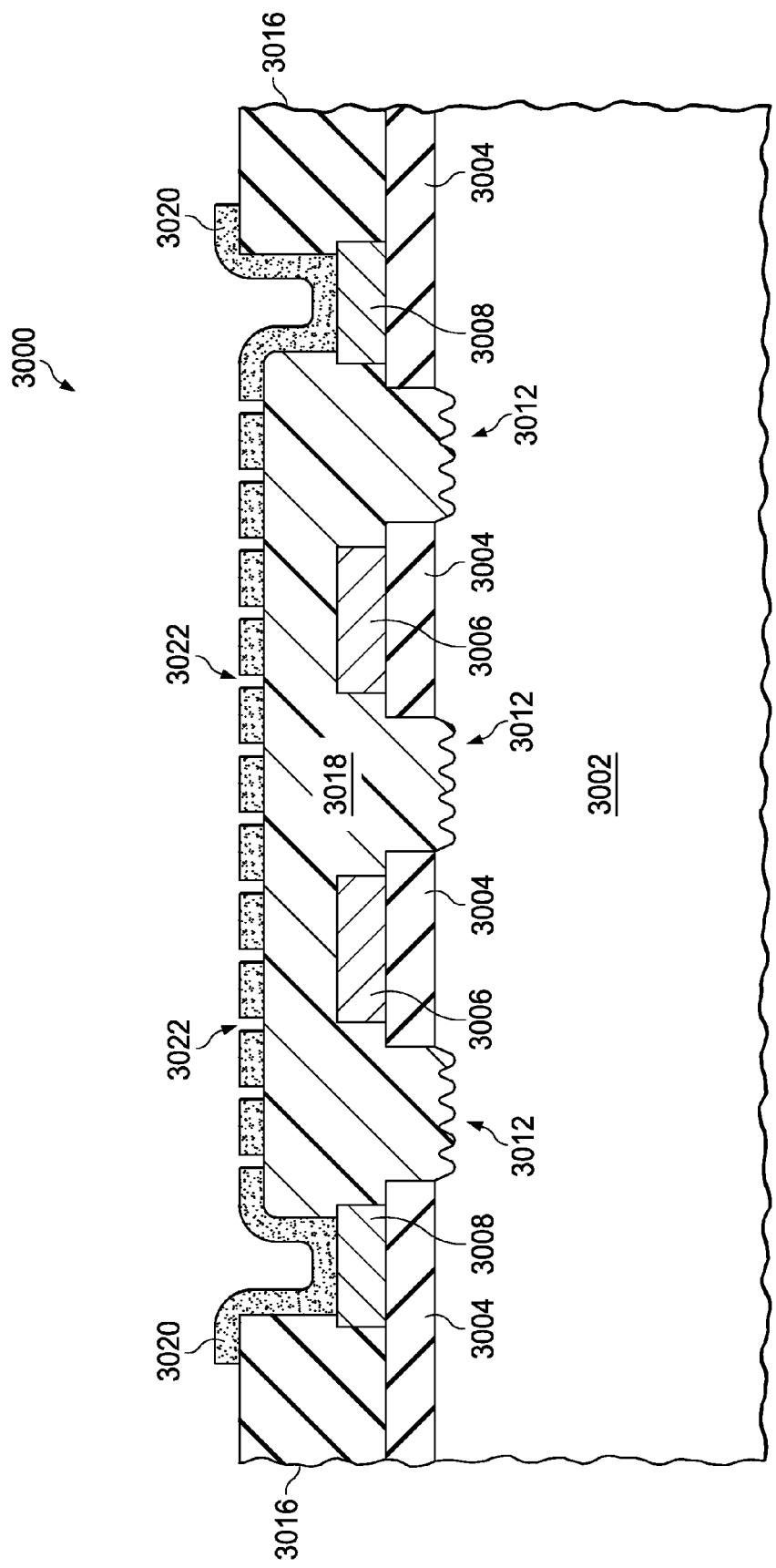

Referring to FIG. 3D, a contiguous permeable membrane (3020) is formed on the capacitor cavity sacrificial layer (3018), as described in reference to FIG. 1E. The permeable membrane (3020) provides a second capacitor plate of the capacitive microphone. Membrane holes (3022) are formed in the permeable membrane (3020). In one realization of the instant embodiment, a vertical separation between a bottom surface of the permeable membrane (3020) and a top surface of the fixed plate (3006) is less than 200 nanometers. In an alternate realization of the instant embodiment, vertical separation between the bottom surface of the permeable membrane (3020) and the top surface of the fixed plate (3006) is less than 100 nanometers.

Figure 3E:
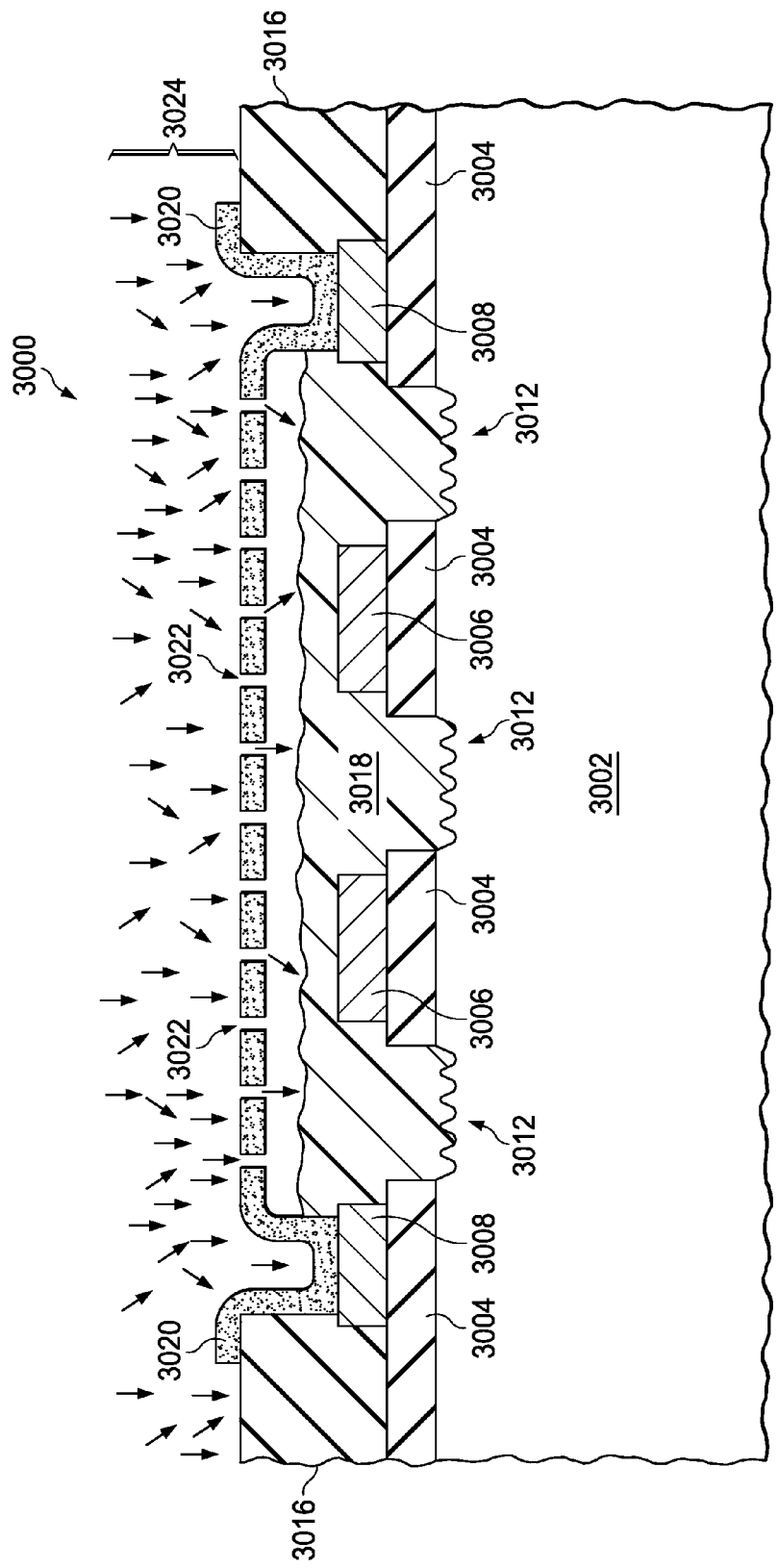
Figure 3F:
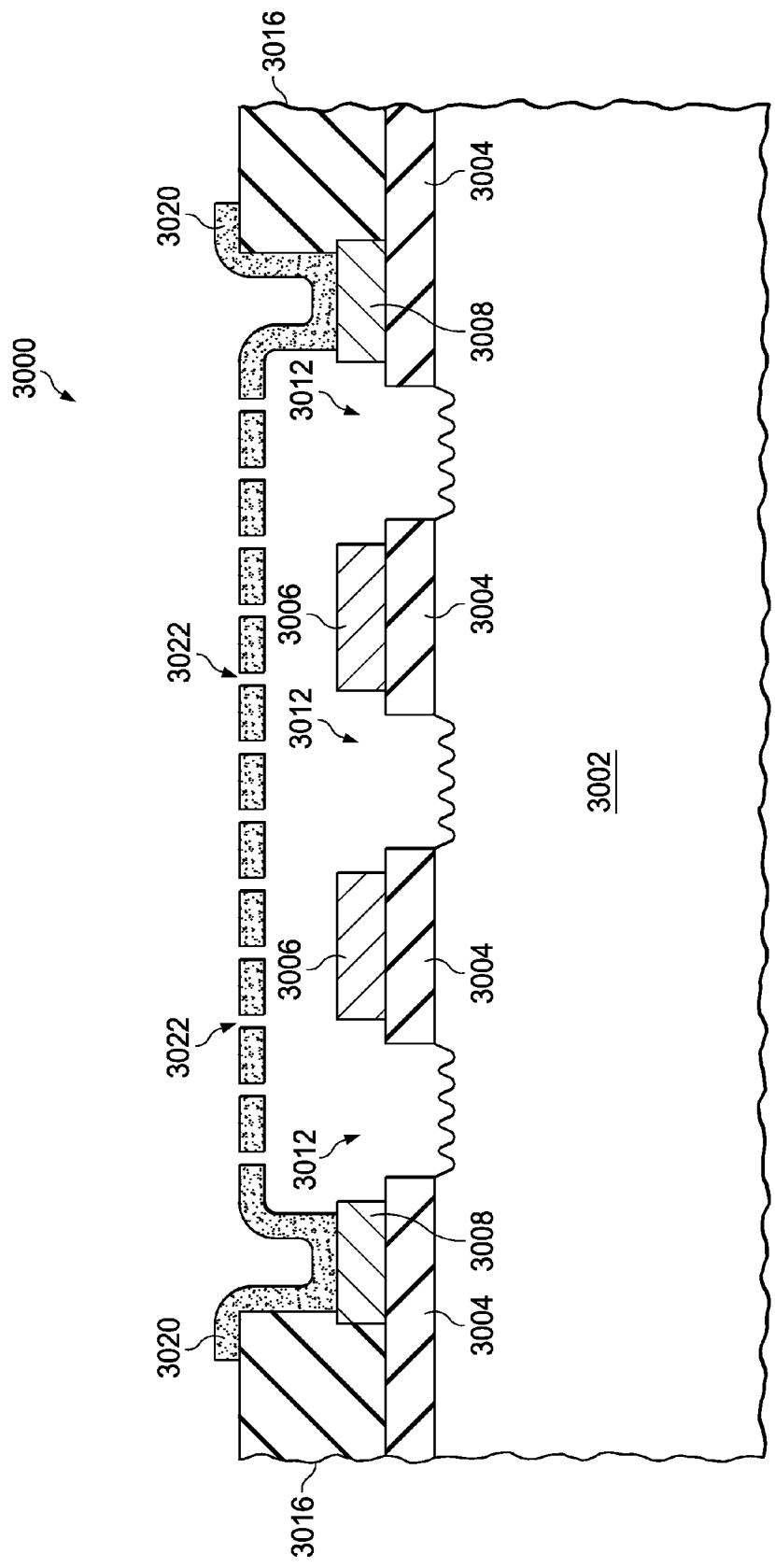

Referring to FIG. 3E, a sacrificial layer removal process (3024) is performed to remove sacrificial material from the capacitor cavity sacrificial layer (3018), as described in reference to FIG. 1F. The sacrificial layer removal process (3024) is continued until substantially all the sacrificial material is removed from the capacitor cavity sacrificial layer (3018), as depicted in FIG. 3F.

Figure 3G:
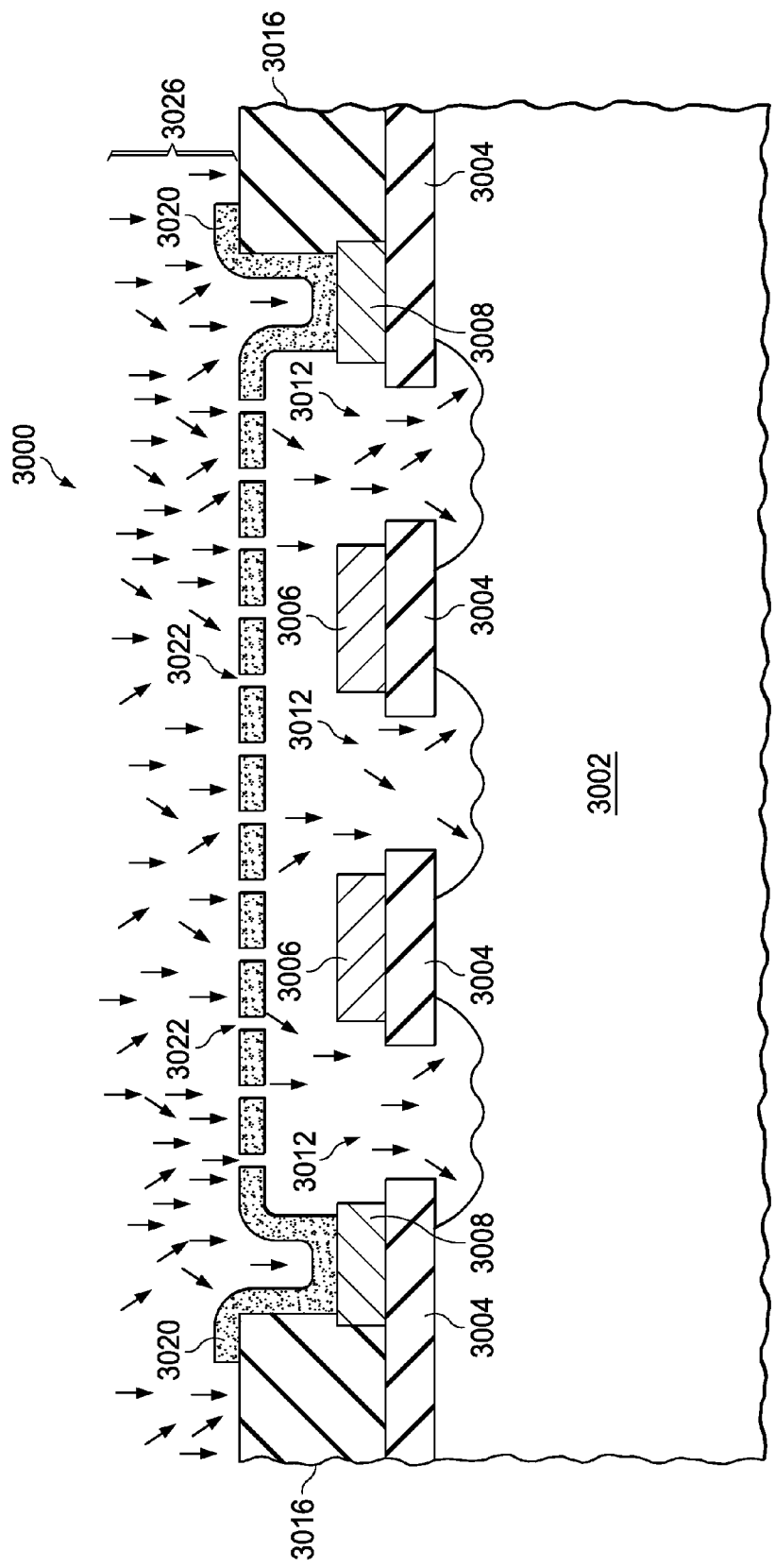

Referring to FIG. 3G, a cavity formation process (3026) is performed to provide reactive species through the membrane holes (3022) to the substrate (3002), as described in reference to FIG. 1G. Reactive species from the cavity formation process (3026) diffuse through the access holes (3012) and remove semiconductor material from the substrate (3002) as described in reference to FIG. 1G and FIG. 1H.

Figure 3H:
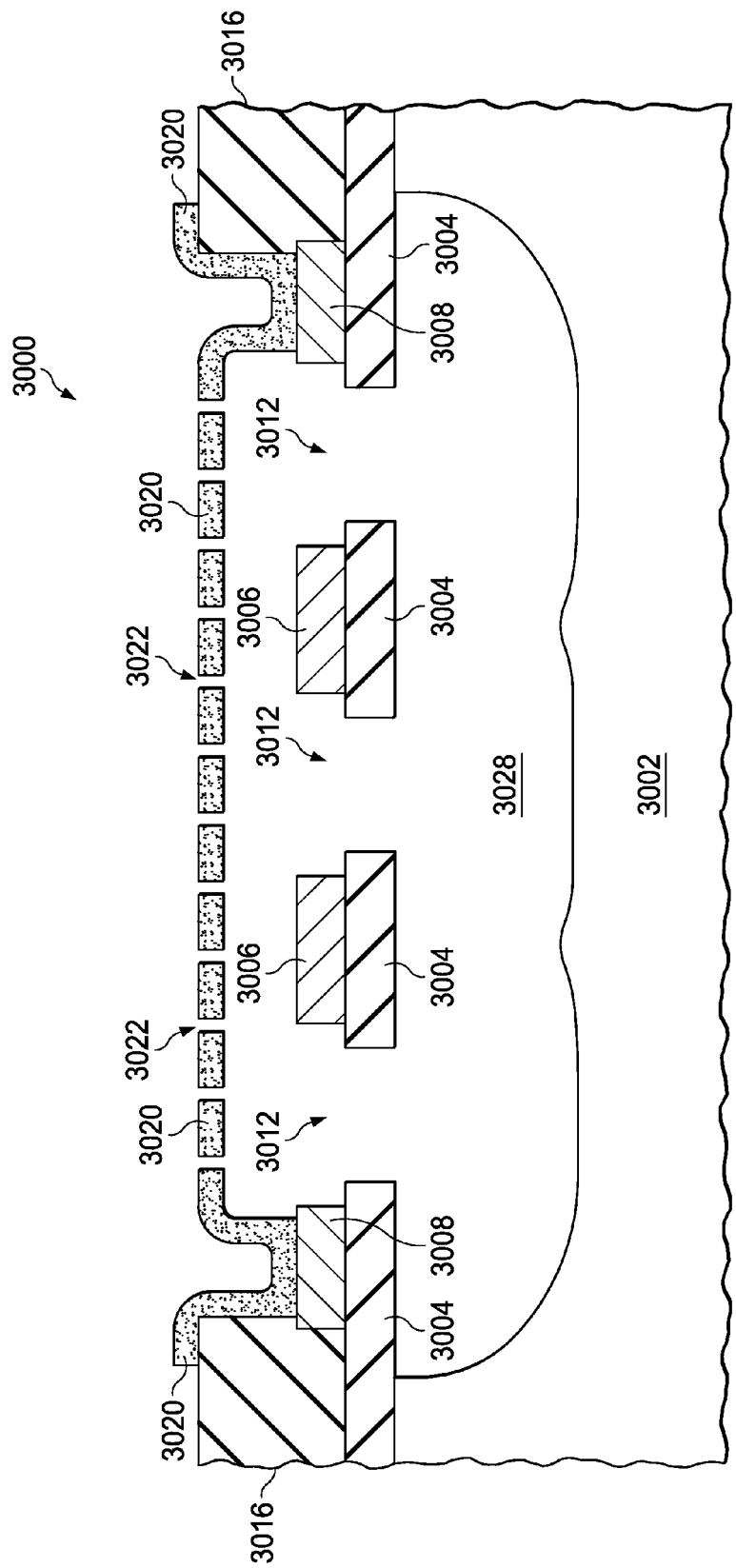

FIG. 3H depicts the integrated circuit (3000) after formation of the capacitive microphone is substantially complete. A back side cavity (3028) has been formed in the substrate (3002) under the dielectric support layer (3004), such that a bottom of the back side cavity (3028) is within the substrate (3002). A protective coating (not shown) may optionally be formed on exposed surfaces of the membrane (3020) and the back side cavity (3028) for protection during an operational lifetime of the capacitive microphone. The back-side cavity connects to a space between the fixed plate (3006) and the membrane (3020) through the access holes (3012). In one realization of the instant embodiment, the back side cavity (3028) may extend laterally beyond the membrane (3020). In one realization of the instant embodiment, a volume of the back side cavity (3028) is more than 100 times as large as a volume of the space between the fixed plate (3006) and the membrane (3020). In a further embodiment, the volume of the back side cavity (3028) is more than 1000 times as large as the volume of the space between the fixed plate (3006) and the membrane (3020).

Figure 4A:
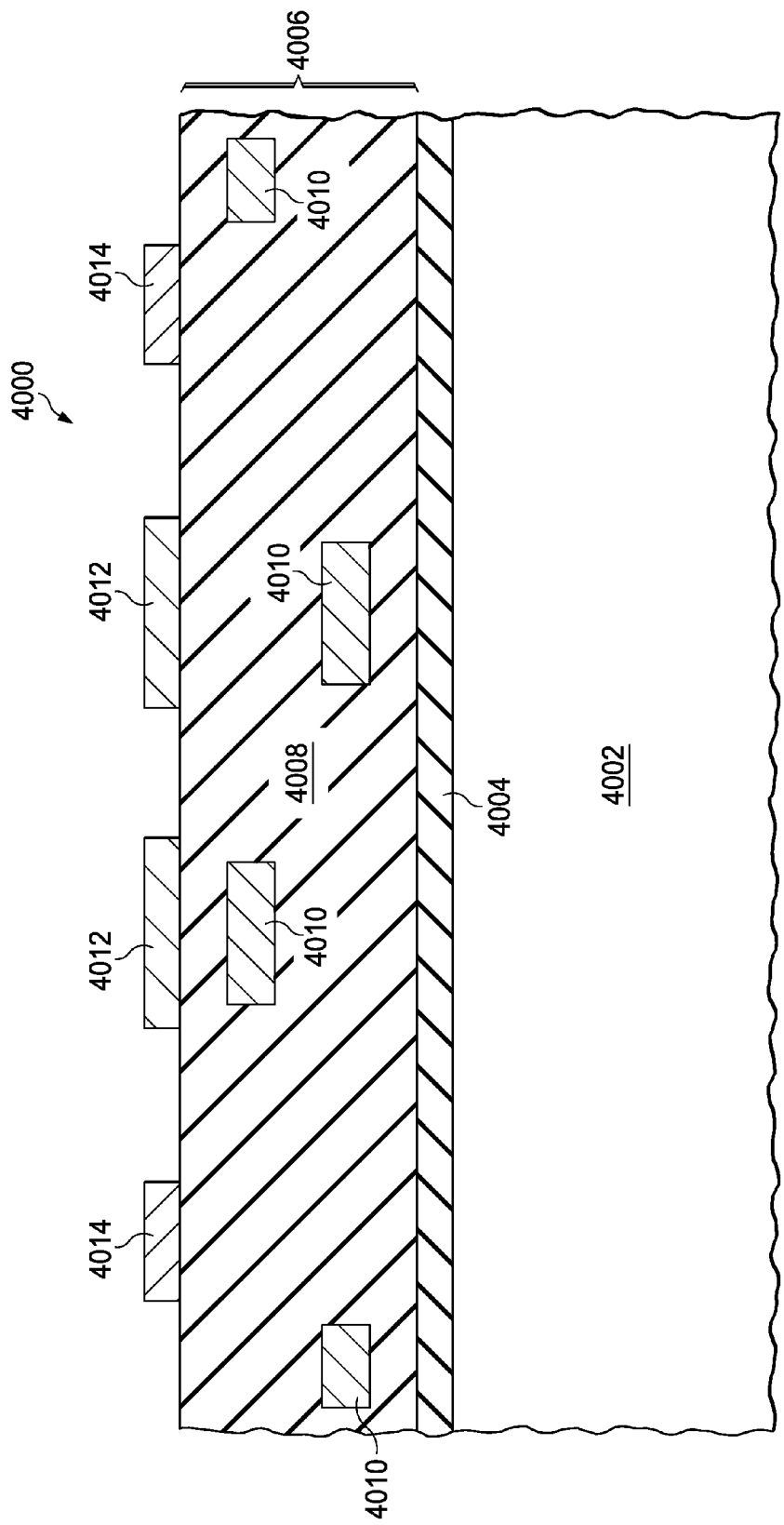
FIG. 4A through FIG. 4G are cross-sections of an integrated circuit containing a capacitive microphone formed according to a third embodiment, depicted in successive stages of fabrication.

FIG. 4A through FIG. 4G are cross-sections of an integrated circuit containing a capacitive microphone formed according to a third embodiment, depicted in successive stages of fabrication. Referring to FIG. 4A, the integrated circuit (4000) is formed in and on a substrate (4002) as described in reference to FIG. 1A. In the instant embodiment, a dielectric support layer (4004) is formed on a top surface of the substrate (4002) in an area defined for the capacitive microphone. In one realization of the instant embodiment, the dielectric support layer (4004) may extend across the entire top surface of the integrated circuit (4000). An interconnect region (4006) is formed above the dielectric support layer (4004), which includes dielectric layers (4008) and metal interconnect components (4010). In some realizations of the instant embodiment, no metal interconnect components (4010) are located in the area defined for the capacitive microphone. In FIG. 4A and following figures of the instant embodiment, boundary lines between the dielectric layers in the interconnect region (4006) are not shown for clarity. A fixed plate (4012) is formed above the interconnect region (4006) in a region defined for the capacitive microphone. In one realization of the instant embodiment, the fixed plate (4012) is formed of similar materials as the metal interconnect components (4010) in the interconnect region (4006). Optional membrane terminals (4014) may be formed concurrently with the fixed plate (4012), as depicted in FIG. 4A, or may be formed in other fabrication steps. In one realization of the instant embodiment, the fixed plate (4012) and optional membrane terminals (4014), if present, include aluminum. In an alternate realization, the fixed plate (4012) and optional membrane terminals (4014), if present, include copper. A protective layer (not shown), possibly an electrically insulating layer, may optionally be formed over the fixed plate (4012) to isolate the fixed plate (4012) during an operational lifetime of the capacitive microphone.

Figure 4B:
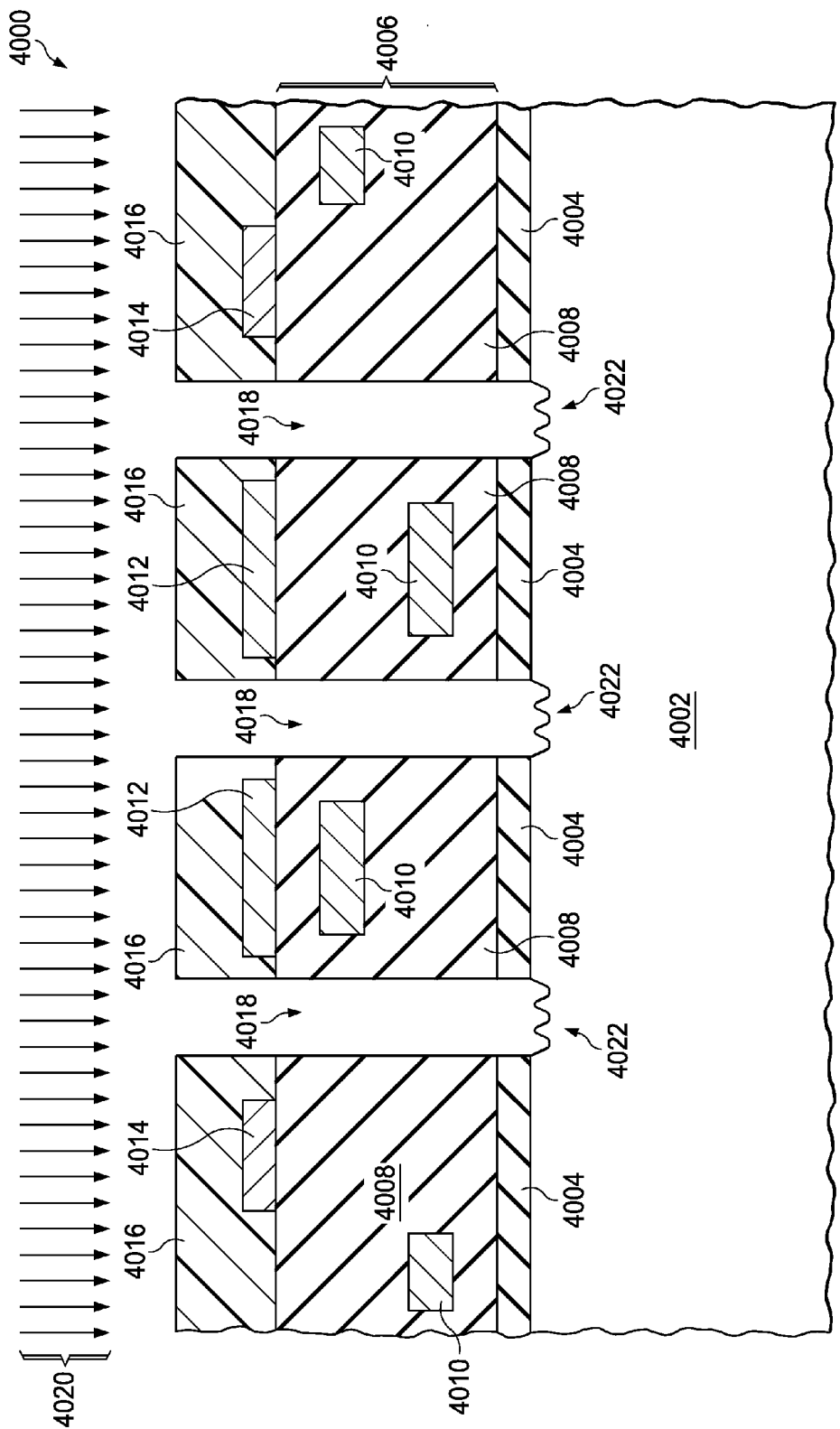

Referring to FIG. 4B, an access via photoresist pattern (4016) is formed on an existing top surface of the integrated circuit (4000) to define areas for access vias (4018) in the interconnect region (4006) and access holes (4022) through the dielectric support layer (4004). An access via etch process (4020) removes dielectric material from the interconnect region (4006) and the dielectric support layer (4004) to form the access vias (4018) through the interconnect region (4006) and access holes (4022) through the dielectric support layer (4004). In one realization of the instant embodiment, the access via etch process (4020) may be performed using an RIE process with a fluorine containing plasma. The access vias (4018) extend through the dielectric support layer (4004) to the semiconductor material in the substrate (4002). The access via photoresist pattern (4016) is removed after formation of the access vias (4018) is complete, as described in reference to FIG. 2C.

Figure 4C:
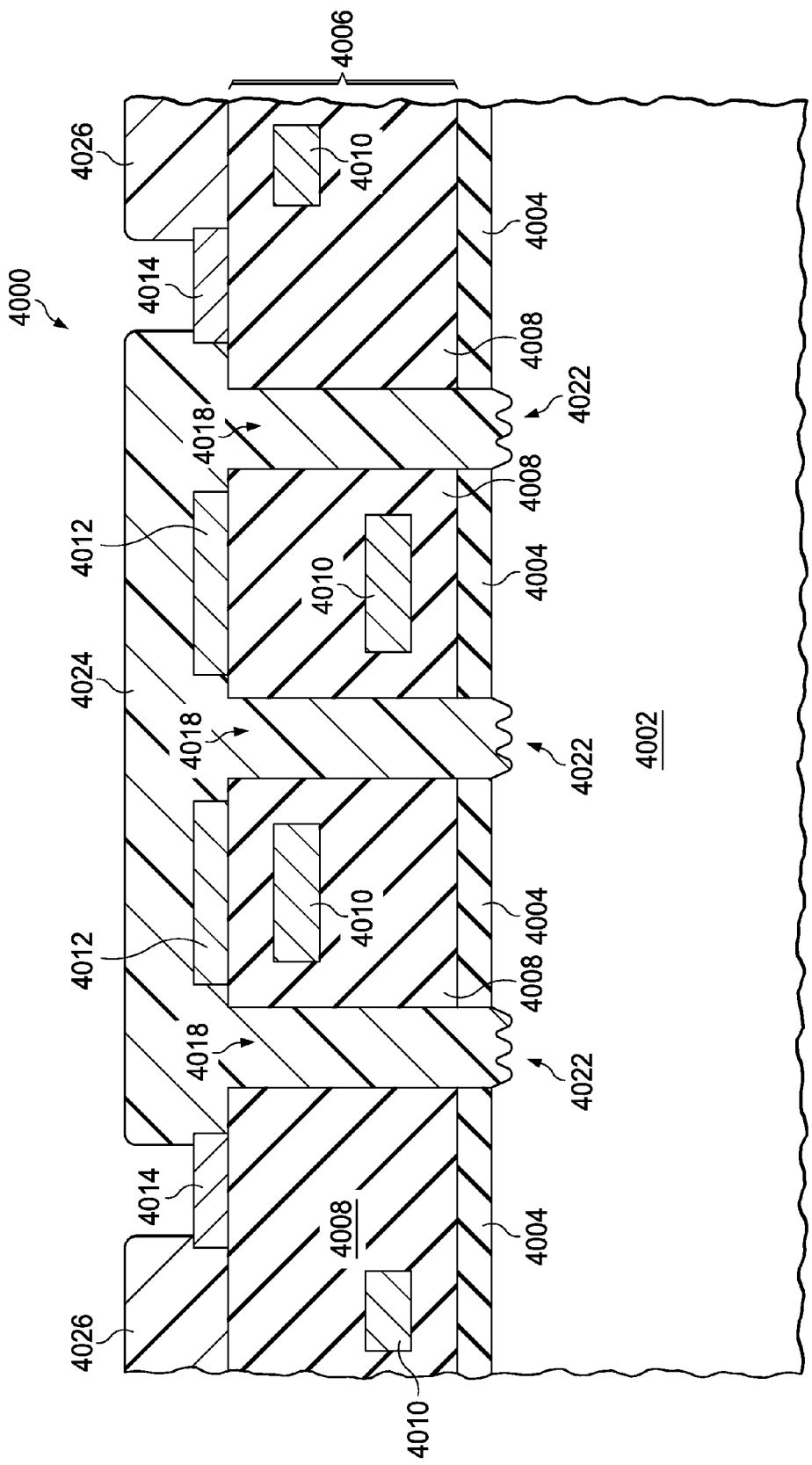

Referring to FIG. 4C, a capacitor cavity sacrificial layer (4024) is formed above the fixed plate (4012), as described in reference to FIG. 2D. The capacitor cavity sacrificial layer (4024) includes sacrificial material such as photoresist or polyimide. In one realization of the instant embodiment, additional sacrificial material (4026) may be formed outside the area defined for the capacitive microphone. The sacrificial material of the capacitor cavity sacrificial layer (4024)

extends into the access vias (4018), and may fill the access vias (4018) as depicted in FIG. 4C.

Figure 4D:
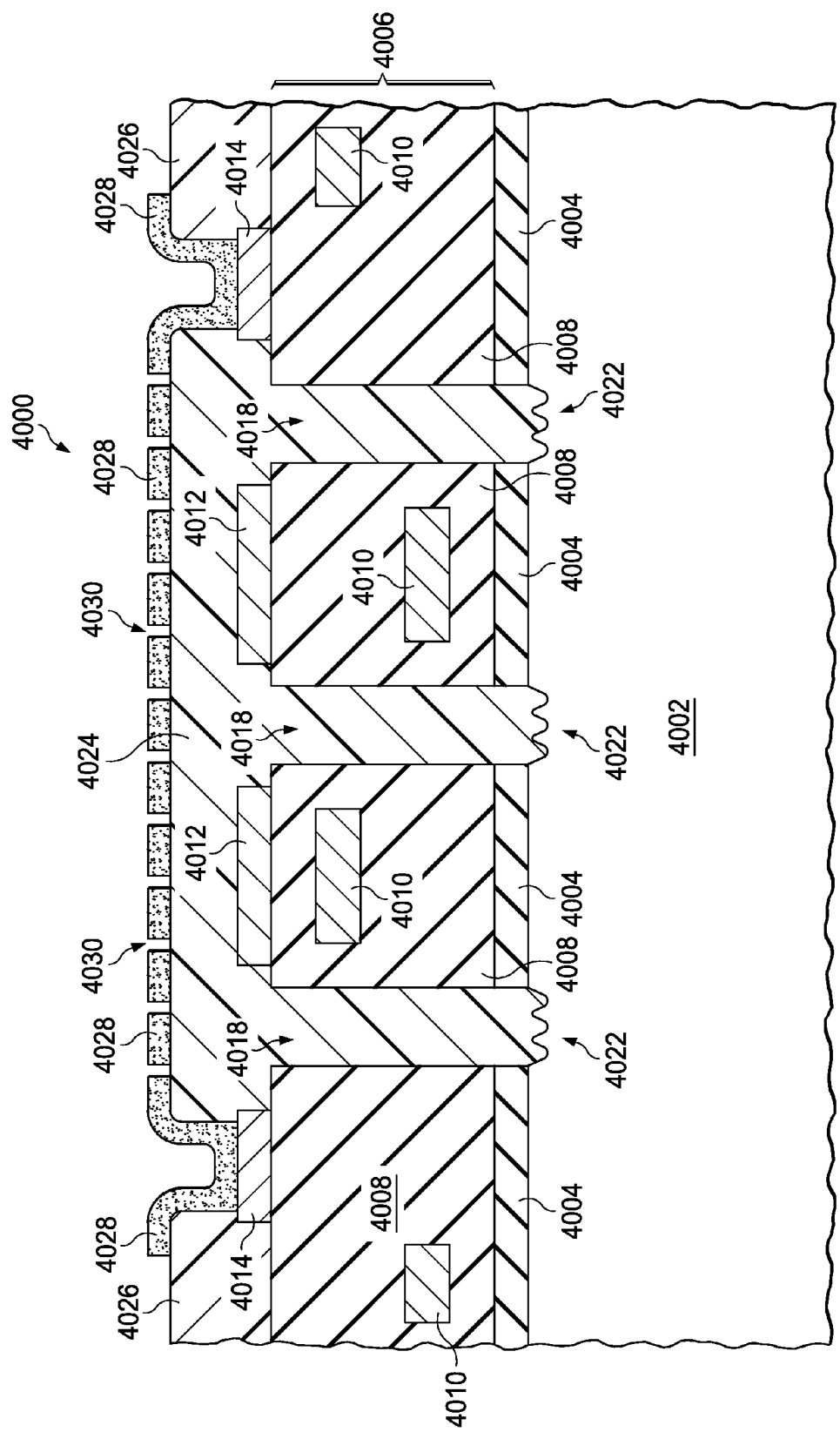

Referring to FIG. 4D, a contiguous permeable membrane (4028) is formed on the capacitor cavity sacrificial layer (4024), as described in reference to FIG. 1E. Membrane holes (4030) are formed in the permeable membrane (4028) as described in reference to FIG. 1E. In one realization of the instant embodiment, a vertical separation between a bottom surface of the permeable membrane (4028) and a top surface of the fixed plate (4012) is less than 200 nanometers. In an alternate realization, the vertical separation between the bottom surface of the permeable membrane (4028) and the top surface of the fixed plate (4012) is less than 100 nanometers.

Figure 4E:
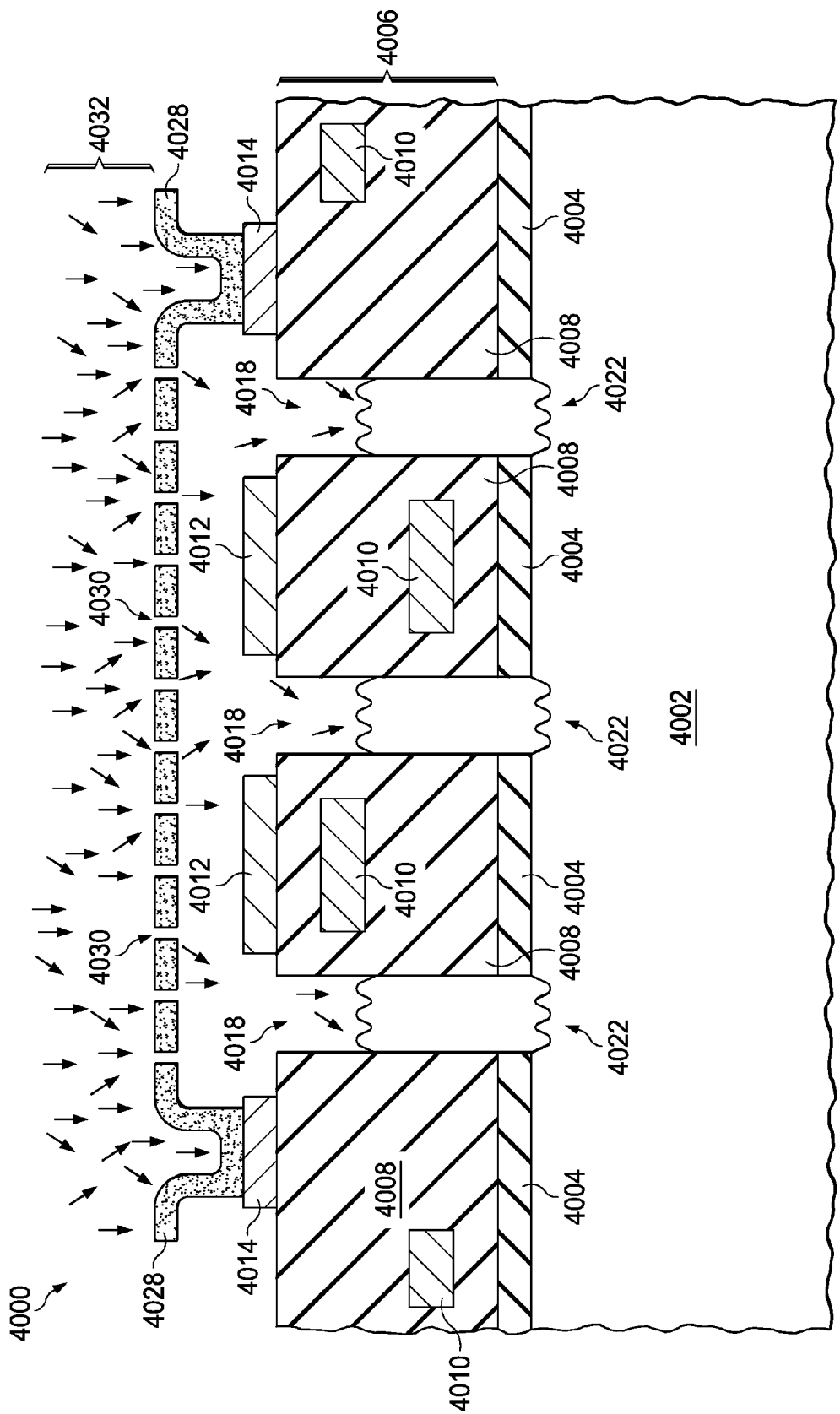

Referring to FIG. 4E, a sacrificial layer removal process (4032) is performed to remove sacrificial material from the capacitor cavity sacrificial layer, as described in reference to FIG. 1F. In the instant embodiment, sacrificial material is removed from the access vias (4018).

Figure 4F:
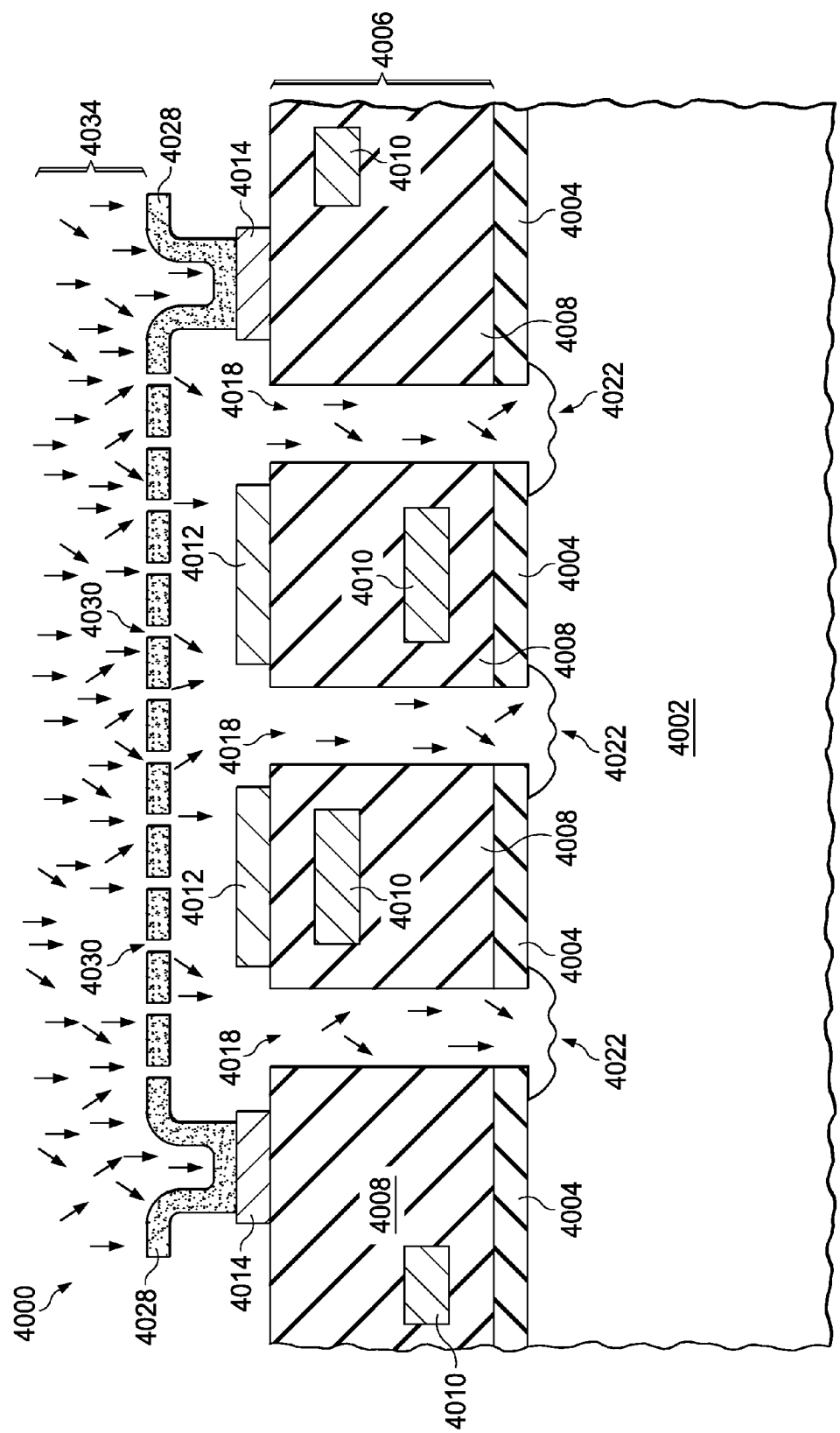

Referring to FIG. 4F, a cavity formation process (4034) is performed to provide reactive species through the membrane holes (4030) to the substrate (4002), as described in reference to FIG. 1G. Reactive species from the cavity formation process (4034) diffuse through the access vias (4018) and remove semiconductor material from the substrate (4002) as described in reference to FIG. 1G and FIG. 1H.

Figure 4G:
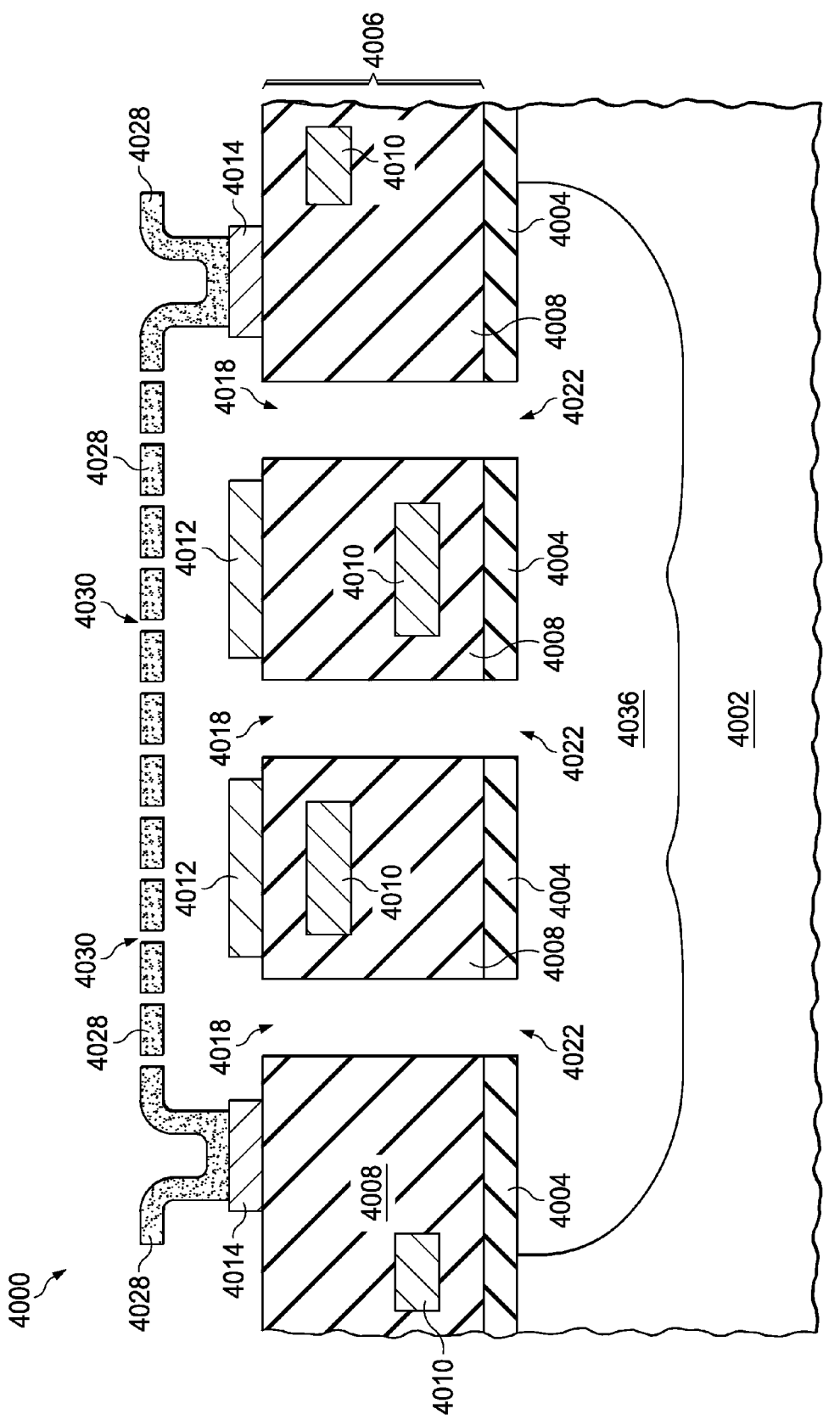

FIG. 4G depicts the integrated circuit (4000) after formation of the capacitive microphone is substantially complete. A back side cavity (4036) has been formed in the substrate (4002) under the dielectric support layer (4004), such that a bottom of the back side cavity (4036) is within the substrate (4002). A protective coating (not shown) may optionally be formed on exposed surfaces of the membrane (4028) and the back side cavity (4036) for protection during an operational lifetime of the capacitive microphone. The back-side cavity (4036) connects to a space between the fixed plate (4012) and the membrane (4028) through the access vias (4018). In one realization of the instant embodiment, the back side cavity (4036) may extend laterally beyond the membrane (4028). In one realization of the instant embodiment, a sum of a volume of the back side cavity (4036) and a volume of the access vias (4018) is more than 100 times as large as a volume of the space between the fixed plate (4012) and the membrane (4028). In a further embodiment, the sum of the volume of the back side cavity (4036) and the volume of the access vias (4018) is more than 1000 times as large as the volume of the space between the fixed plate (4012) and the membrane (4028).

Figure 5:
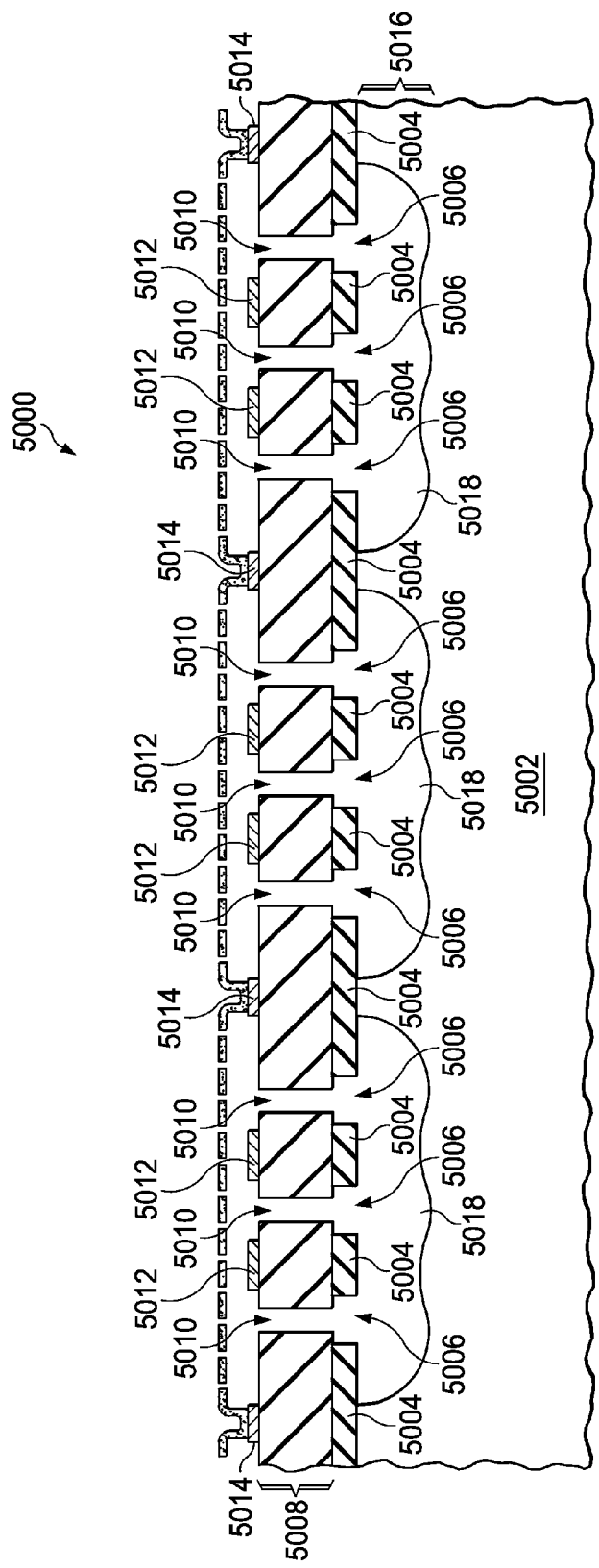
FIG. 5 is a cross-section of an integrated circuit containing a capacitive microphone with a back side cavity including more than one cavity chamber.

FIG. 5 is a cross-section of an integrated circuit containing a capacitive microphone with a back side cavity including more than one cavity chamber. The integrated circuit (5000) is built in and on a substrate (5002) as described in reference to FIG. 1A. In one embodiment, field oxide (5004) may be formed at a top surface of the substrate (5002) with access holes (5006) as described in reference to FIG. 1A. In an alternate embodiment, a dielectric support layer may be formed on the top surface of the substrate (5002) as described in reference to FIG. 3A, and access holes (5006) formed in the dielectric support layer as described in reference to FIG. 3B. In some embodiments, an interconnect region (5008) may be formed above the substrate (5002) and the field oxide (5004) or the dielectric support layer, according to the specific embodiment, as described in reference to FIG. 2A and FIG. 4A. In such embodiments, access vias (5010) are formed through the interconnect region (5008), as described in reference to FIG. 2C and FIG. 4B. A fixed plate (5012) of the capacitive microphone is formed above the substrate, as described in reference to FIG. 1B, FIG. 2B, FIG. 3A or FIG. 4A, according to the specific embodiment. A permeable membrane (5014) of the capacitive microphone is formed above the fixed plate (5012), separated from the fixed plate (5012) by a space as described in reference to FIG. 1D through FIG. 1F, FIG. 2D through FIG. 2F, FIG. 3C through FIG. 3E, or FIG. 4C through FIG. 4E, according to the specific embodiment.

A back side cavity (5016) with multiple cavity chambers (5018) is formed in the substrate (5002) below the fixed plate, as described in reference to FIG. 1G through FIG. 1I, FIG. 2G and FIG. 2H, FIG. 3G and FIG. 3H, or FIG. 4F and FIG. 4G, according to the specific embodiment. In some embodiments, the membrane (5014) may be supported above substrate regions between the cavity chambers (5018) as depicted in FIG. 5. In some realizations of embodiments containing multiple cavity chambers, the back side cavity (5016) may extend laterally beyond the membrane (5014).

In some embodiments, a sum of a volume of the back side cavity (5016) and a volume of the access vias (5010) if present is more than 100 times as large as a volume of the space between the fixed plate (5012) and the membrane (5014). In further embodiments, the sum of the volume of the back side cavity (5016) and the volume of the access vias (5010) if present is more than 1000 times as large as the volume of the space between the fixed plate (5012) and the membrane (5014).

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A process of forming an integrated circuit including a capacitive microphone, comprising:
   providing a substrate, said substrate including a semiconductor region which extends to a surface of said substrate;
   forming a dielectric support layer at said surface of said substrate;
   forming access holes through said dielectric support layer;
   forming a fixed plate of said capacitive microphone on said dielectric support layer;
   forming a capacitor cavity sacrificial layer on said fixed plate, said capacitor cavity sacrificial layer containing a sacrificial material;
   forming a permeable membrane on said capacitor cavity sacrificial layer;
   removing said sacrificial material from said capacitor cavity sacrificial layer, such that a space separates said permeable membrane from said fixed plate; and
   performing a cavity formation process so as to form a back side cavity in said substrate by providing etchants through said permeable membrane and through said access holes to said substrate, such that said back side cavity is connected through said access holes to said space between said permeable membrane and said fixed plate, and such that a bottom of said cavity is located in said substrate.

2. The process of claim 1, wherein said dielectric support layer includes field oxide formed by shallow trench isolation (STI) region forming processes.

3. The process of claim 2, further including forming one or more silicide block layers on said surface of said substrate over said access holes.

4. The process of claim 1, wherein said dielectric support layer includes silicon nitride.

5. The process of claim 1, further including forming an interconnect region on said dielectric support layer, such that said interconnect region is formed before said step of forming said fixed plate is performed, so that said fixed plate is located on said interconnect region.

6. The process of claim 1, wherein performing the cavity formation process further includes forming a plasma containing $SF_6$ gas, such that fluorine containing reactive species are provided to said substrate.

7. The process of claim 1, wherein said back cavity is formed with a volume more than 100 times larger than a volume of said space between said permeable membrane and said fixed plate.

8. The process of claim 1, wherein said back side cavity is formed to include more than one cavity chamber.

9. A process of forming an integrated circuit including a capacitive microphone, comprising:
    providing a substrate, said substrate including a semiconductor region which extends to a surface of said substrate;
    forming a dielectric support layer at said surface of said substrate;
    forming access holes through said dielectric support layer;
    forming a fixed plate of said capacitive microphone over said dielectric support layer;
    forming a permeable membrane of said capacitive microphone, said permeable membrane being located on said fixed plate, such that a space separates said permeable membrane from said fixed plate; and
    forming a back side cavity in said substrate, said back side cavity being connected through said access holes to said space between said permeable membrane and said fixed plate, such that a bottom of said cavity is located in said substrate.

10. The process of claim 9, wherein said dielectric support layer includes field oxide formed by shallow trench isolation (STI) region forming processes.

11. The process of claim 9, wherein said dielectric support layer includes silicon nitride.

12. The process of claim 9, wherein said fixed plate is formed to contact said dielectric support layer.

13. The process of claim 9, wherein said back side cavity is formed to include more than one cavity chamber.

14. The process of claim 9, wherein said back cavity is formed with a volume more than 100 times larger than a volume of said space between said permeable membrane and said fixed plate.

15. A process of forming an integrated circuit including a capacitive microphone, comprising:
    forming a dielectric layer comprising dielectric filled trench regions laterally spaced at intervals in a microphone region of a surface of a substrate;
    forming a first layer of conductive material over the filled trench regions leaving at least portions of the intervals between the trench regions uncovered by conductive material, the conductive material formed over the trench regions defining a first capacitor plate and terminal regions peripherally of the first capacitor plate;
    forming a layer of sacrificial material over the first capacitor plate leaving at least portions of the terminal regions exposed;
    forming a second layer of conductive material over the layer of sacrificial material over the first capacitor plate and extending down to the terminal regions peripherally of the first capacitor plate, the second layer of conductive material defining a second capacitor plate spaced above the first capacitor plate between the terminal regions and formed with holes therethrough;
    removing material of the layer of sacrificial material from the spacing between the first and second capacitor plates; and
    after removing the material, etching the substrate at the intervals through the holes to form a cavity to a depth including under the filled trench regions.

16. The process of claim 15, further comprising forming silicide blocking material over the substrate spanning the intervals spacing the trench regions prior to forming the first layer of conductive material; and wherein the first layer of conductive material is formed by siliciding polycrystalline silicon formed over the filled trench regions.

* * * * *